(12) United States Patent
Zani et al.

(10) Patent No.: US 8,658,994 B2
(45) Date of Patent: Feb. 25, 2014

(54) APPARATUS AND METHOD FOR CONTROLLED PARTICLE BEAM MANUFACTURING

(75) Inventors: Michael John Zani, Laguna Niguel, CA (US); Mark Joseph Bennahmias, Mission Viejo, CA (US); Jeffrey Winfield Scott, Carpenteria, CA (US)

(73) Assignee: Nexgen Semi Holding, Inc., Laguan Niguel, CA (US)

( * ) Notice: Subject to any disclaimer, the term of this patent is extended or adjusted under 35 U.S.C. 154(b) by 0 days.

(21) Appl. No.: 13/354,938

(22) Filed: Jan. 20, 2012

(65) Prior Publication Data

US 2012/0112323 A1 May 10, 2012

Related U.S. Application Data

(63) Continuation of application No. 12/642,615, filed on Dec. 18, 2009, now abandoned, which is a continuation of application No. 11/841,565, filed on Aug. 20, 2007, now Pat. No. 7,659,526, which is a continuation of application No. 11/484,015, filed on Jul. 10, 2006, now Pat. No. 7,259,373.

(60) Provisional application No. 60/697,780, filed on Jul. 8, 2005.

(51) Int. Cl.
*H01L 21/265* (2006.01)
*H01L 21/425* (2006.01)
*H01L 29/06* (2006.01)
*G21K 5/10* (2006.01)

(52) U.S. Cl.
USPC ............. 250/492.3; 250/492.22; 250/492.23; 438/514

(58) Field of Classification Search
USPC ........... 250/309, 491.1, 492.1, 492.2, 492.21, 250/492.22, 492.23, 492.3; 257/E21.214, 257/E21.247, E21.248, E21.334; 438/514, 438/758; 428/195.1, 206; 216/66
See application file for complete search history.

(56) References Cited

U.S. PATENT DOCUMENTS

| | | | | |
|---|---|---|---|---|
| 6,462,347 | B1* | 10/2002 | Oh | 250/492.21 |
| 7,259,373 | B2* | 8/2007 | Zani et al. | 250/309 |
| 7,659,526 | B2* | 2/2010 | Zani et al. | 250/492.21 |
| 7,755,066 | B2* | 7/2010 | Evans | 250/492.21 |
| 2003/0205679 | A1* | 11/2003 | Benveniste | 250/423 R |
| 2011/0065237 | A1* | 3/2011 | Bennahmias et al. | 438/104 |
| 2013/0040458 | A1* | 2/2013 | Scott et al. | 438/669 |
| 2013/0181139 | A1* | 7/2013 | Eisner et al. | 250/396 R |

* cited by examiner

*Primary Examiner* — Bernard E Souw
(74) *Attorney, Agent, or Firm* — Knobbe, Martens, Olson & Bear, LLP

(57) ABSTRACT

A chamber for exposing a workpiece to charged particles includes a charged particle source for generating a stream of charged particles, a collimator configured to collimate and direct the stream of charged particles from the charged particle source along an axis, a beam digitizer downstream of the collimator configured to create a digital beam including groups of at least one charged particle by adjusting longitudinal spacing between the charged particles along the axis, a deflector downstream of the beam digitizer including a series of deflection stages disposed longitudinally along the axis to deflect the digital beams, and a workpiece stage downstream of the deflector configured to hold the workpiece.

20 Claims, 31 Drawing Sheets

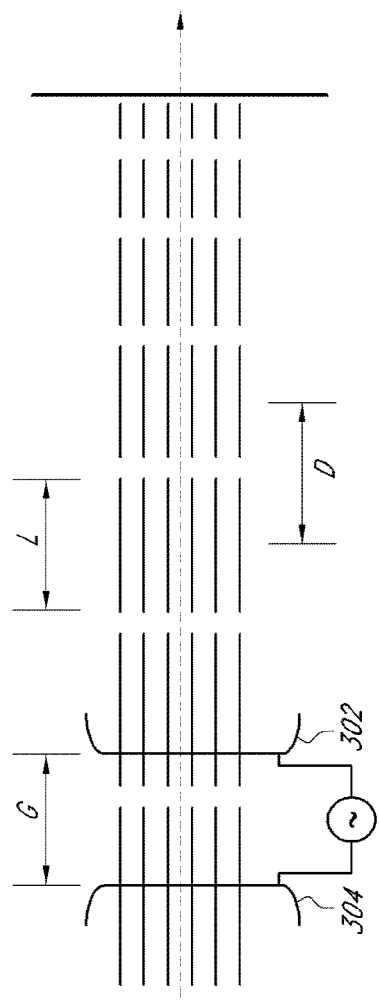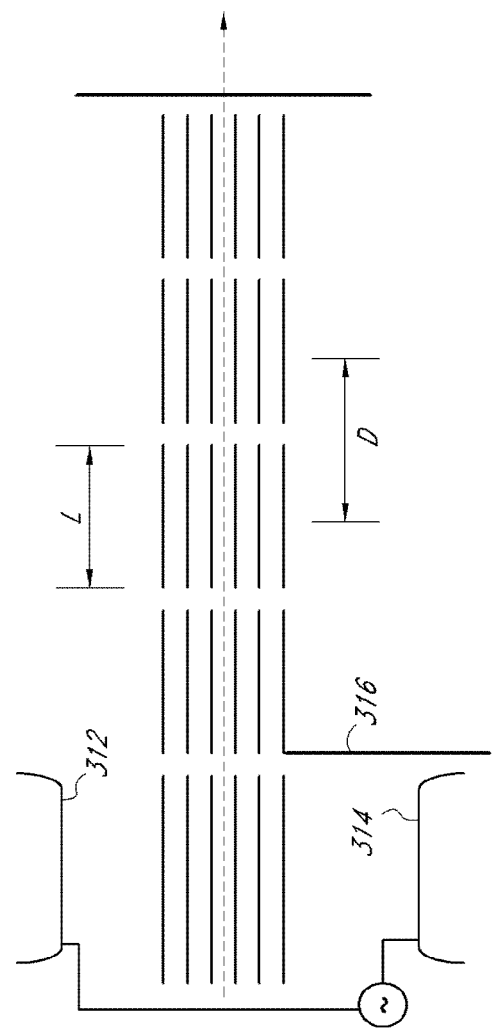

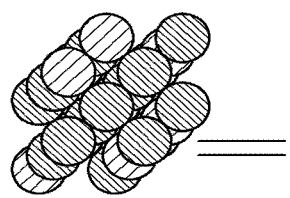
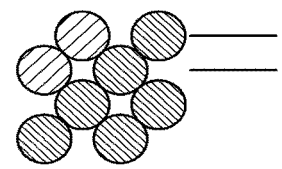
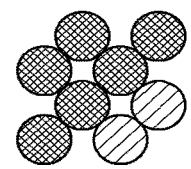
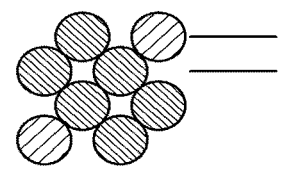
FIG. 21G

APPARATUS AND METHOD FOR CONTROLLED PARTICLE BEAM MANUFACTURING

RELATED APPLICATIONS

This application is a continuation of U.S. patent application Ser. No. 12/642,615, filed Dec. 18, 2009, which is a continuation of U.S. patent application Ser. No. 11/841,565, filed Aug. 20, 2007, now U.S. Pat. No. 7,659,526, which is a continuation of U.S. patent application Ser. No. 11/484,015, filed Jul. 10, 2006, now U.S. Pat. No. 7,259,373, which claims a benefit under 35 U.S.C. §119(e) to U.S. Provisional Patent Application Ser. No. 60/697,780, filed Jul. 8, 2005, entitled "Controlled Ion Beam Semiconductor Manufacturing," the entirety of each of which is hereby incorporated by reference.

BACKGROUND

1. Field

The present application relates to semiconductor manufacturing. More specifically, the present application relates to methods and apparatuses for direct write semiconductor manufacturing.

2. Description of the Related Art

Photolithography has been a key patterning step in most integrated circuit fabrication processes. Resist, a photosensitive plastic, is spun on a workpiece, baked, and exposed in a pattern through a reticle, usually by ultraviolet (UV) light. After development and a second bake, the surface is left partially covered by an inert organic film that resists various treatments to which the workpiece is subjected. Such treatments include material removal by wet chemical etch or by gaseous plasma etch, doping by ion implantation (e.g., broad beam implantation), and addition of material (e.g., lift-off). The preparation, exposure, development, clean, care, and stripping of resist can increase the number of fabrication steps tenfold, requiring expensive equipment and facilities to establish stable, qualified, and high yield fabrication.

Photolithography has been the main lithographic tool for processing patterns of resist down to 45 nanometers (nm). However, present and future microelectronics will require minimum feature sizes below 45 nm. While advances in a number of lithography techniques (e.g., ultraviolet (UV), enhanced ultraviolet (EUV) emersion, maskless emersion, laser, phase-shift, projection ion, and electron beam lithography (EBL)) may enable high-scale production at these dimensions, they are all nearing their theoretical limits with respect to wavelength, overlay accuracy, and/or cost. Pushed to the limit, the weaknesses of each process present difficult problems, and the resulting patterning defects can result in significant yield loss.

SUMMARY

In certain embodiments, a chamber for exposing a workpiece to charged particles comprises a charged particle source for generating a stream of charged particles, a collimator configured to collimate and direct the stream of charged particles from the charged particle source along an axis, a beam digitizer downstream of the collimator configured to create a digital beam comprising groups of at least one charged particle by adjusting longitudinal spacing between the charged particles along the axis, a deflector downstream of the beam digitizer comprising a series of deflection stages disposed longitudinally along the axis to deflect the groups of charged particles, and a workpiece stage downstream of the deflector configured to hold the workpiece. In some embodiments, a workpiece processing apparatus comprises the chamber, a loadlock chamber, and a processing chamber selected from deposition, etch, and thermal conditioning chambers.

In certain embodiments, an apparatus for processing a workpiece from an initial state to a substantially finished state without removing the workpiece from the apparatus comprises a loadlock chamber, an exposure chamber, and a processing chamber.

In certain embodiments, a method of processing a workpiece in an apparatus comprises exposing portions of the workpiece to charged particles in an exposure chamber. The exposing comprises forming a stream of charged particles, collimating and propagating the stream along an axis, digitizing the stream into a digital beam comprising at least one charged particle, deflecting the groups of charged particles using a series of deflection stages disposed longitudinally along the axis, demagnifying the groups, and directing the demagnified groups onto the workpiece.

In certain embodiments, a method of processing a workpiece comprises exposing the workpiece, the workpiece being resistless during the exposing, after the exposing, processing the workpiece, wherein the processing is selected from depositing, etching, and rapid thermal annealing, after the processing, exposing the workpiece for a second time, the workpiece being resistless during the second exposing, and after the second exposing, processing the workpiece for a second time, wherein the processing is selected from depositing, etching, and rapid thermal annealing.

In certain embodiments, a method of implanting at least one dopant into a workpiece comprises directing a beam comprising at least one ion species onto the workpiece and, during the directing, altering at least one parameter of the beam.

In certain embodiments, a method of etching a material from workpiece comprises directing a beam comprising charged particles onto a surface of the workpiece in a pattern in a first chamber to chemically modify portions of the surface, transferring the workpiece to a second chamber, and applying an etchant to the workpiece, the etchant reacting with the chemically modified portions to cause material removal.

In certain embodiments, a method of depositing a material onto a workpiece comprises directing a beam comprising charged particles onto a surface of the workpiece in a pattern in a first chamber to chemically modify portions of the surface, transferring the workpiece to a second chamber, and applying an reactant to the workpiece, the reactant reacting with the chemically modified portions to cause material deposition.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These and other features, aspects, and advantages of the invention disclosed herein are described below with reference to the drawings of preferred embodiments, which are intended to illustrate and not to limit the invention.

FIG. 3C schematically illustrates an example beam buncher.

FIG. 3D schematically illustrates an example beam blanker.

FIGS. 21A through 21G schematically depict beam writing strategies.

DETAILED DESCRIPTION OF THE PREFERRED EMBODIMENTS

Although certain preferred embodiments and examples are disclosed below, it will be understood by those in the art that the invention extends beyond the specifically disclosed embodiments and/or uses of the invention and obvious modifications and equivalents thereof. Thus, it is intended that the scope of the invention herein disclosed should not be limited by the particular disclosed embodiments described below.

Smaller device geometries may be achieved by direct writing with a beam of charged particles. Focused ion beam (FIB) systems generally do not have sufficient ion exposure to support high throughput manufacturing. Furthermore, only relatively low speed deflection is available using existing ion optics/deflection electronics methodologies, preventing efficient direct write of layers patterned for semiconductor devices. As such, FIB has been limited to mask (e.g., reticle) and semiconductor repair. As FIB technology progressed, it supported the ability to simultaneously deposit, etch, and implant patterns directly on workpieces without the use of resist. Problems remained, however, including low energy systems with little-to-no wafer writing software, no metrology systems, and minimal beam current densities and deflection speeds necessary to support the lithography on a high manufacturing scale. Modifications and improvements to FIB systems in accordance with embodiments described herein can achieve suitable manufacturing throughput in both resist processing and resistless fabrication of semiconductor workpieces and other media (e.g., photomask, compact disk (CD), digital video disk (DVD), high definition DVD (HD DVD), Blue-Ray, etc.).

The physical properties of a beam of charged particles traveling along an axis with a distribution transverse to the axis can be modified to provide a high speed, digital (or "pulsed") distributed writing beam. Various methods can be used to create a wave of temporally and spatially defined high-density charged particle nodes and low density (or no density) anti-nodes, traveling in a longitudinal path of accelerated particles (herein referred to as a "digitized beam"). For example, a beam buncher can be used to create localized groups (or "flashes" or "packets") of the charged particles. These groups of charged particles may contain one or more charged particles. The digital beam is then passed through a deflector, whereupon variations in voltage cause the groups of charged particles to change position relative to the direction of propagation. Changes in voltage can be timed in phase with the particle nodes, thereby yielding efficient deflection. The presence of a sharp edge of the antinode effectively provides fast beam blanking for direct write. Applying the digitized beam to the surface of a workpiece allows resistless patterned processing, including deposition, etching, and/or implantation of material to the surface of the workpiece and/or high resolution resist exposure.

Figure 1B:
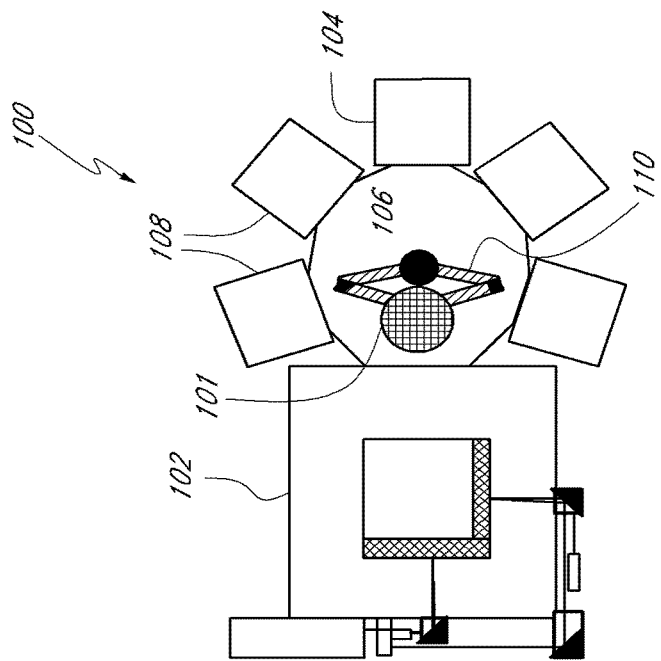
FIG. 1B is a top schematic view of the apparatus of FIG. 1A.
Figure 1A:
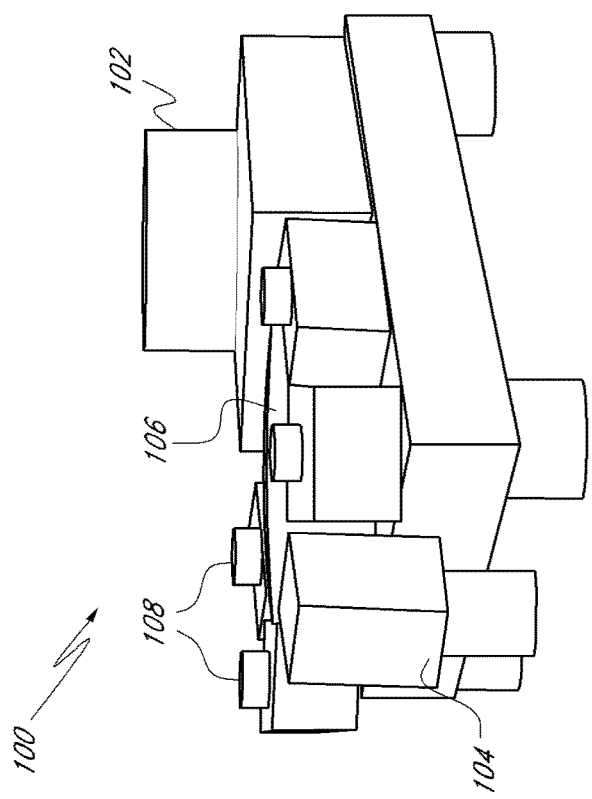
FIG. 1A is a perspective view of an example apparatus for controlled particle beam manufacturing.

FIG. 1A is a perspective view of an example apparatus 100 in accordance with certain embodiments disclosed herein. FIG. 1B is a top schematic view of the apparatus 100 of FIG. 1A. The apparatus 100 comprises an exposure chamber 102, a load lock chamber 104, a transport module 106, and a plurality of processing chambers 108. Although not illustrated, it will be understood that the apparatus 100 comprises a gas manifold system and an automated process controller, described in more detail below.

The load lock chamber 104 may house workpieces 101 that are not being processed, for example, before and/or after processing in the apparatus 100. In certain embodiments, the load lock chamber 104 is configured to achieve vacuum such that an automated material handling system (AMHS) 110 of the transport module 106 in communication with the load lock chamber 104 may insert and/or remove workpieces 101 without having to be pumped down to or up from vacuum between each transfer. In certain embodiments, the loadlock chamber 104 is configured to accept a front opening unified pod (FOUP).

The transport module 106 is configured to move workpieces 101 within the apparatus 100. The transport module 106 comprises an AMHS 110 configured to manipulate at least one workpiece 101. A suitable AMHS 110 can be chosen based on the design of the exposure chamber 102, the loadlock chamber 104, the transport module 106, and/or the process chambers 108. In certain embodiments, the AMHS 110 comprises a plurality of transport arms such that workpieces 101 may be manipulated simultaneously (or in parallel).

In some embodiments, the transport module 106 includes a workpiece prealigner, such that the workpieces 101 removed by the transport arm 110 and subsequently placed into the exposure chamber 102 or a process chamber 108 are in an orientation that is ready for processing in the exposure chamber 102 or a process chamber 108. For example, the prealigner may use charge-coupled device (CCD) or other imaging devices to locate a flat, notch, or other identifying feature of the workpiece 101. In some embodiments, the prealigner is configured to determine overlay parameters of alignment features on the workpiece 101. The overlay parameters may comprise x and y offset, rotation, etc.

Depending on the type and size of the workpiece 101, a variety of vacuum and handling systems can be used in the apparatus 100. A system capable of processing a variety of workpieces preferably uses a high speed workpiece handling system. Workpiece-into-vacuum throughput can be increased by aligning the workpiece under vacuum on the workpiece stage instead of outside the vacuum system. A standard workpiece holder (e.g., a wafer magazine) can be pumped to high vacuum within a few minutes. Alignment of the workpiece 101 under vacuum may increase wafer into vacuum throughput.

In some embodiments, the transport module 106 comprises one or more processing substations, for example comprise one or more buffer zones to hold workpieces 101 between processing steps, a particle contamination detector, a temperature quenching station, and/or a metrology station. The metrology station may be selected from any tool appropriate for that type of workpiece, including, but not limited to, an energy dispersive analyzer (EDS), a wavelength dispersive analyze (WDS), a secondary ion mass spectrometer (SIMS), a scanning electron microscope (SEM), a two-dimensional laser scanning imager, a three-dimensional imaging laser radar (LADAR), a thermal imager, a millimeter wave imager, a workpiece imager, and a camera.

Figure 2:
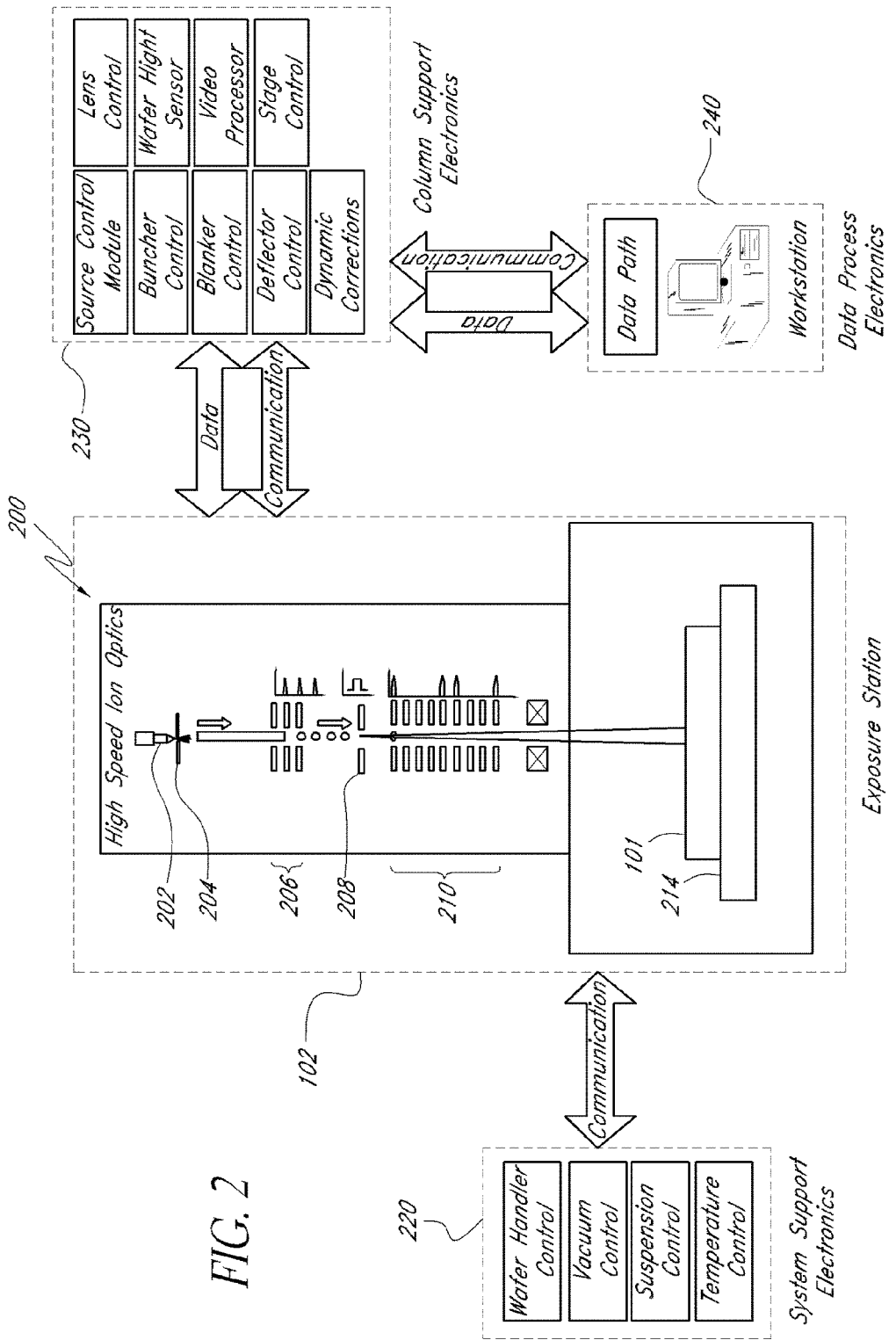
FIG. 2 is a schematic block diagram of an example charged particle exposure chamber.
Figure 3A:
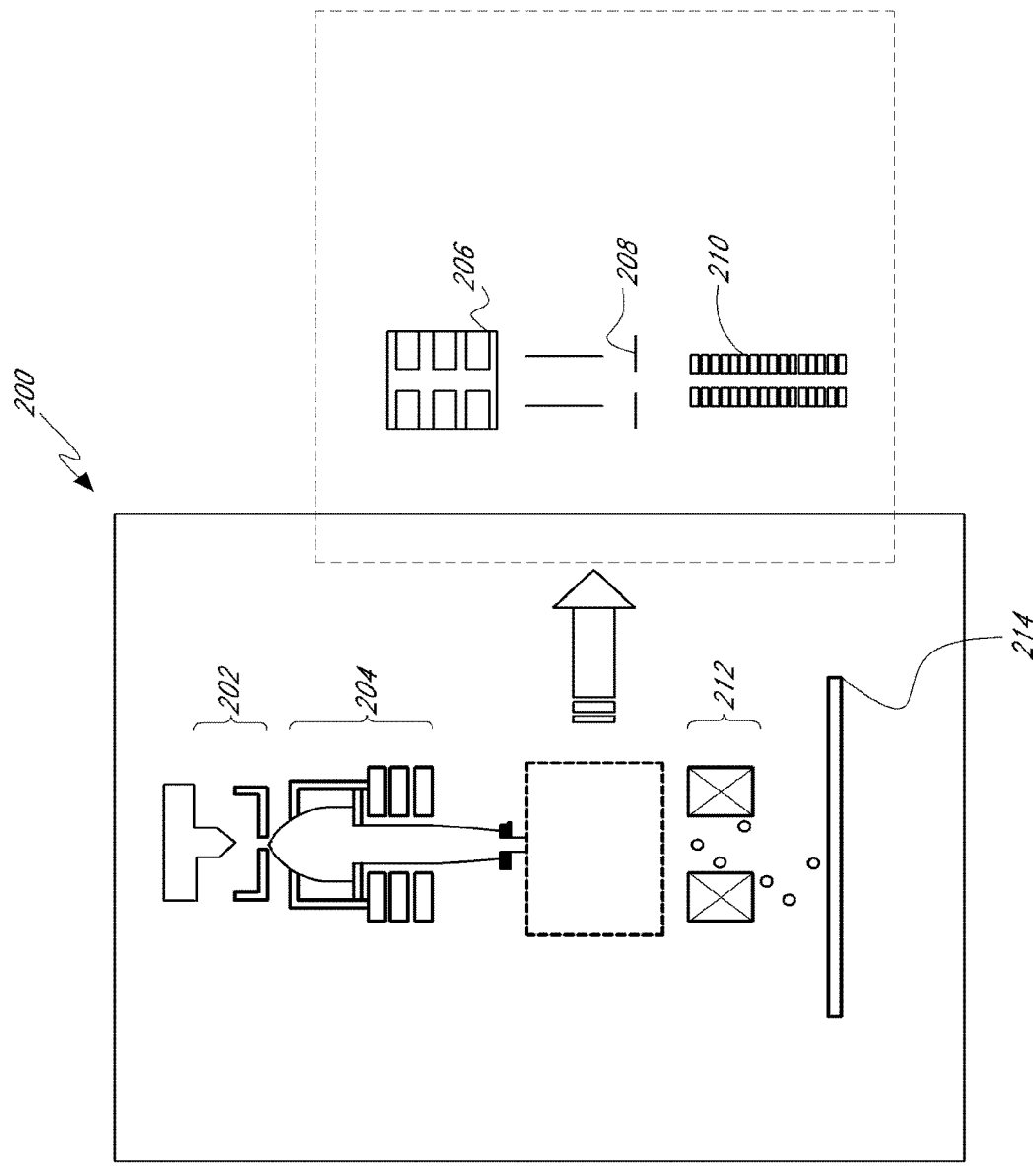
FIG. 3A is a schematic block view of an example charged particle column.

The exposure chamber 102 is configured to expose a workpiece 101 to a digital beam of charged particles. As shown in FIG. 2, the exposure chamber 102 comprises a beam column 200, illustrated in more detail in FIG. 3A. The beam column 200 comprises a charged particle source 202 for generating a stream of charged particles. Although systems and methods are described in certain embodiments herein with reference to ions, it will be understood that some systems and methods may utilize charged particles comprising electrons and positrons. Charged particles may include one or more species of positively and negatively charged ions, as well as singly, doubly, triply, etc. charged ions. In some embodiments, the charged particle source 202 is adapted to generate a plurality of ion species. In some embodiments, the charged particle source 202 is adapted to provide a current of 1,000 amperes/$cm^2$ (A/$cm^2$) focused to a 10 nm spot as measured at the target.

Liquid metal ion source (LMIS) technology enables the formation of high current density charged particle beams. An example technique to create a LMIS is a heated reservoir of liquid metal from which a needle protrudes downward. The metal flows down the needle by capillary action. An electric field from an extraction electrode pulls the liquid at the tip of the needle into a sharp cusp (a "Taylor Cone") from which ions are emitted. The point source is very bright (e.g., about $10^9$ A/steradian/$cm^2$), and, with suitable optics, permits the beam diameter to be as small as 2 nm. A variety of alloys provides several ion species common for semiconductor fabrication.

Accelerating and focusing a distributed energy of ions can introduce chromatic aberrations resulting in a loss of current density efficiency of the ion optic system. The ion beam energy distribution can be measured as the beam full-width-half-max (FWHM) and can be distributed as much as 12%. Improving the current density efficiency and resolving long and short term stability issues can make LMIS performance adequate for a semiconductor processing tool. One aspect of various embodiments of the present invention is the realization that beams of charged particles are composed of a distribution of high and low energy trails, which can be advantageously grouped.

At least two mechanisms can contribute to the broadening of the energy distributions: first, effects related to the formation of the ions; and second, space charge forces after ion formation. Ion emissions from a LMIS source are formed either by direct field desorption of an ion at the emitter tip or by field ionization of desorbed atoms at some distance from the emitter tip. Ions generated close to the tip surface can exchange charge with neutral atoms further downstream, forcing a zero energy ion at that point. Since the electric field in the emitter area is high (e.g., between about 20 and 50 Volts/nm), ions formed at different distances from the emitter can have different energies. Space charge effects broaden the energy distribution of the beam, particularly at low velocities. Therefore, the column 200 preferably is configured to accelerate the ions to full energy directly after formation. The use of low-mass species may aid in ion acceleration when the use of such species is appropriate.

Space charge effects are also aggravated by higher currents. For the LMIS source, the width of the energy distribution is preferably proportional to the current to the ⅔ power. As such, practical application of traditional LMIS sources to lithography show behavior similar to electron beams.

Figure 3B:
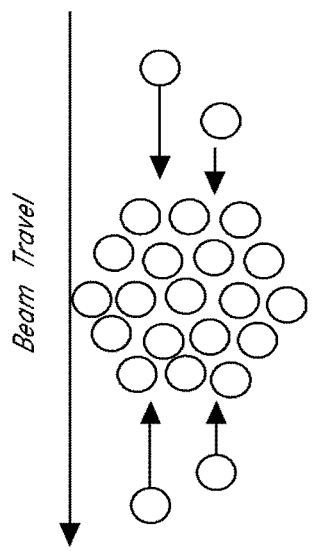
FIG. 3B schematically illustrates bunching of charged particles.

A limitation on the maximum current density achievable with LMIS-based systems results from the energy distribution of the ion beam that is caused by the achromatic aberration in the upper ion optical system. However, the use of a beam digitizer 206 downstream of the charged particle source 202 that is configured to adjust the longitudinal spacing between charged particles so as to create temporally and spatially resolved groups of the charged particles along the axis of propagation can effectively slow faster moving particles and can speed slower moving particles to obtain a uniform velocity, and thus a uniform energy distribution (accelerating voltage) within each group of the digital beam, thereby reducing the effect of the charged particle source chromatic aberration, as illustrated in FIG. 3B.

Figure 8:
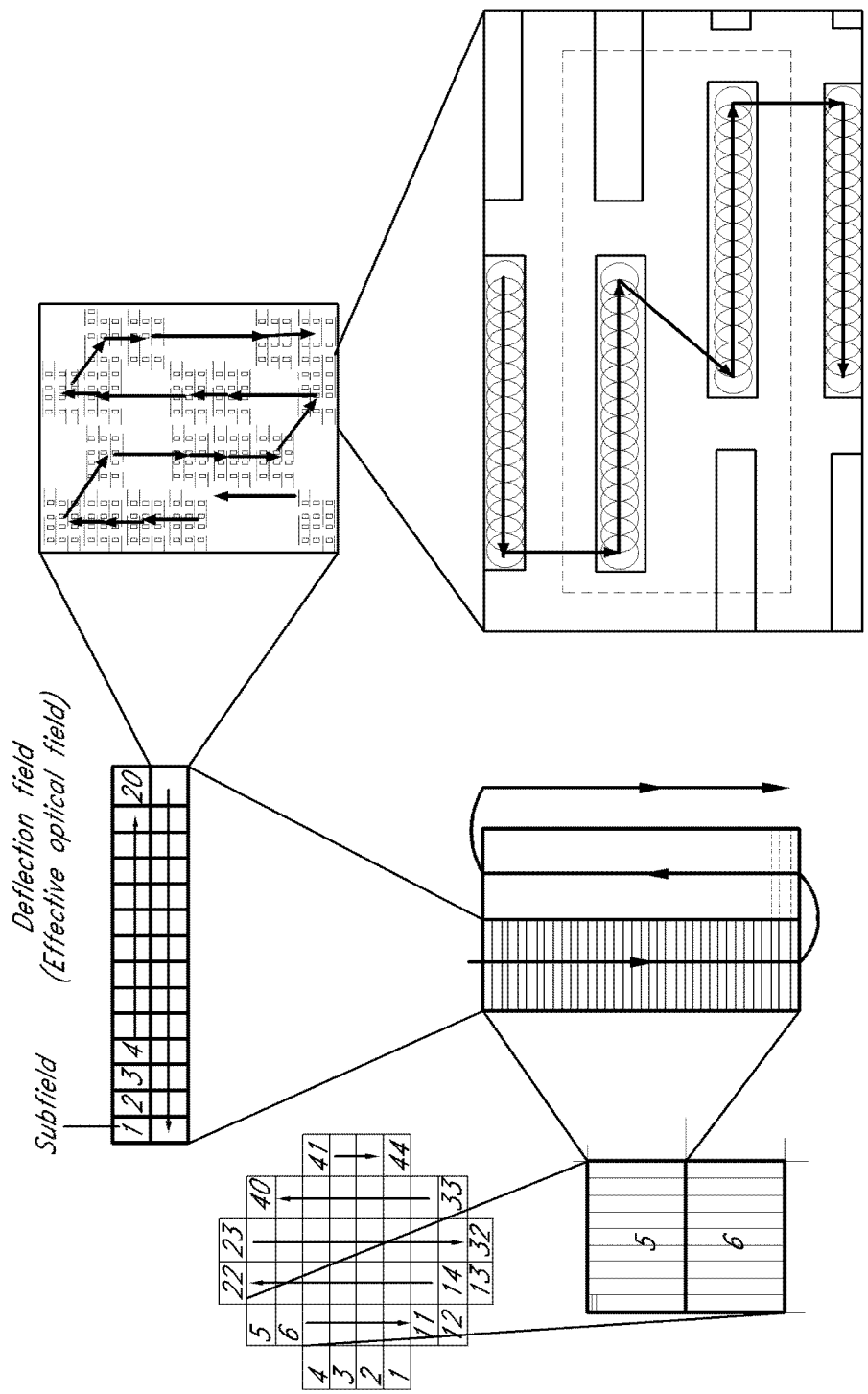
FIG. 8 illustrates an example writing strategy.

Similar to the drift of an electron beam, a LMIS Taylor cone emission unpredictably drifts in a figure-8 pattern over about a one hour period. Undetected, this drift can cause pattern placement errors. Source lifetime and current stability are barriers to the practical application for production throughput processing tools using traditional LMIS sources. Further improvements at the charged particle source 202 can improve the stability and lifetime, thereby reducing frequent source replacement. The broadening of the energy distribution associated with ion formation can be reduced or minimized by operating the LMIS at low temperature, thereby decreasing the neutral atom density in the proximity of the tip. The energy distribution can also be reduced or minimized by choosing a low vapor pressure species, for example by selecting a doubly ionized species that has a low charge exchange cross-section and that is formed at the surface of the tip, known to have a narrow energy distribution, and by using a species that has the additional benefit of a small virtual source. It will be appreciated that other techniques can also be used.

In certain embodiments, extended lifetime of the charged particle source 202 may be achieved by conditioning the source driving parameters prior to operation. As such, the incorporation of an automated conditioning routine can contribute to the extended life and stability of the charged particle source 202. Additionally, a continuous flow strategy, such as impregnated electrode-type needles with hardened tips, can further extend the life span of the charged particle source 202. Second order effects of improved life span can include emission current and position stability improvement. Source emission position stability can be successfully corrected by using an error feedback from occasional beam registrations and adjustment to source servomotors. Although increased ion beam current density is preferred, the column 200 in the exposure chamber 102 need not increase the beam current density.

Other charged particle sources 202 may also be used with the embodiments disclosed herein. For example and without limitation, the charged particle source 202 may comprise a plasma ion source (PIS), a volume plasma ion source (VPIS), a gas field ionization source (GFIS), a carbon nanotube field emitter, a free electron laser and a target, a pulsed laser ablation ion source, a magnetically confined plasma anode source (MAP), and a thermal field emission (TFE) electron source.

The stream of charged particles emanating from the charged particle source 202 is collimated and directed along a axis by a collimator 204. A variety of collimators 204 comprising a combination of optical elements are appropriate for use in the column 200. For example, and without limitation, the collimator 204 may comprise two or more lenses or a lens and a reflective optic. The collimator 204 may further comprise an aperture configured to shape the charged particle beam. In certain embodiments, the collimator is adapted to direct the charged particle stream at accelerating potentials between about 5 and 30 kilo electron volts (keV). In certain embodiments, the exposure chamber 102 is adapted to direct the charged particle stream at accelerating potentials between about 5 and 500 keV. In some embodiments, a voltage of the collimator 204 is additive to additional voltages, for example applied by a lower column exit aperture.

In embodiments in which the charged particle source 202 is adapted to generate a plurality of ion species, individual ion species can be selected for specific processing applications by filtering the charged particle stream with a particle filter (e.g., a spectrometer filter). For example, a mass separator can be configured to deflect selected ion species into a mass separator aperture plate. The mass separator is preferably disposed between the collimator 204 and the beam digitizer 206. In some embodiments, the mass separator comprises a reflective optic. In some embodiments, the mass separator comprises an ExB lens. In some embodiments, the mass separator comprises a Wein filter.

The beam digitizer 206 is configured to create a digital beam comprising discrete groups of at least one charged particle by adjusting the longitudinal spacing between charged particles along the axis of propagation. In certain embodiments, the beam digitizer 206 is configured to create groups comprising between about 1 and 7,000,000 charged particles, between about 1 and 100,000 charged particles, between about 1 and 10,000 charged particles, or between about 1 and 50,000 charged particles. In some embodiments, the beam digitizer 206 is configured to create longitudinal spacing D between groups of charged particles of less than about 10 m of beam travel, less than about 1 m of beam travel, less than about 10 cm of beam travel, less than about 10 mm of beam travel, less than about 1 mm of beam travel, less than about 500 µm of beam travel, less than about 300 µm of beam travel, less than about 100 µm of beam travel, less than about 10 µm of beam travel, less than about 100 nm of beam travel, less than about 10 nm of beam travel, or less than about 1 nm of beam travel between the groups of charged particles. In some embodiments, the beam digitizer 206 is configured to create longitudinal spacing between the groups of charged particles of between about 1 nm and 10 m of beam travel, between about 1 nm and 1 m of beam travel, between about 1 nm and 10 cm of beam travel, between about 1 nm and 10 mm of beam travel, between about 1 nm and 1 mm of beam travel, between about 1 nm and 500 µm of beam travel, between about 1 nm and 300 µm of beam travel, between about 1 nm and 100 µm of beam travel, between about 1 nm and 10 µm of beam travel, between about 1 nm and 100 nm of beam travel or between about 1 nm and 10 nm of beam travel. The longitudinal spacing between the groups of charged particles may be substantially equal, unequal, periodic, harmonic, etc.

In certain embodiments, the beam digitizer 206 comprises a beam buncher. In a radio frequency (RF) beam buncher, a stream of charged particles pass through a buncher gap where they are acted upon by an alternating potential, RF or multiple modulating potential wave forms, beat wave, harmonic, variable, or a combination thereof. Velocity modulation compresses the charged particles together so that they form spatially and temporally resolved discrete groups of charged particles. In certain embodiments, the frequency and the buncher gap length are configured to match a mean velocity of the groups of charged particles. The applied potential modulates the longitudinal velocity of each charged particle as they pass through the buncher gap so that some charged particles (e.g., charged particles with a lower velocity than the mean velocity) are accelerated while other charged particles (e.g., charged particles with a higher velocity than the mean velocity) are decelerated (e.g., as depicted in FIG. 3B). The gap length of the buncher gap, the magnitude and frequency of the applied potential, and the time of flight (TOF) of the charged particles through the column 200 determine the final characteristics of the digital beam and the groups of charged particles at the surface of the workpiece 101.

FIG. 3C schematically depicts a stream of charged particles traveling through a beam buncher. A potential can be applied across the electrodes 302, 304 of the beam buncher that are separated by buncher gap G. If unaltered thereafter, the charged particles begin to form groups whose length L and separation (spacing) D depend on how far the charged particles have traveled after passing through the beam buncher. In some embodiments, the beam buncher is configured to compress the charged particles into groups during travel. In some embodiments, the beam buncher is configured to apply an electric field to longitudinally compress the groups of charged particles. The charged particles are preferably fully compressed in the longitudinal direction when they reach the workpiece 101 (e.g., as depicted in FIG. 3C). The energy applied by the buncher can be determined by the difference between the initial energy of the stream of charged particles and the final energy of the temporally and spatially resolved groups of the charged particles.

In certain embodiments, the beam buncher comprises a plurality of buncher electrodes and therefore a plurality of buncher gaps. The potential can be selectively applied across two of the electrodes in order to change the characteristics of the digital beam. For example, a potential can be applied across electrodes with a buncher gap G of 1 μm to create nodes with a lower charged particle density and applied across electrodes with a buncher gap G of 3 cm to create nodes with a higher charged particle density.

The relationships between beam buncher input parameters such as beam energy and buncher current, frequency, and gap length and beam buncher output characteristics such as separation D, length L, and density are well known. The beam buncher is preferably operated to provide a given number of charged particles per group. First, the buncher gap, frequency, and beam energy can be held constant while the current is adjusted. Second, the beam energy and buncher current can be held constant while the buncher gap and frequency are adjusted. Other operation configurations are also possible.

In some embodiments, the beam buncher comprises a helical coil that is modulated with a current frequency, resulting in a magnetic field. The longitudinal spacing ("gap") between turns of the coil, the magnitude and frequency of the applied current, and the time of flight (TOF) of the charged particles through the column 200 determine the final characteristics of the digital beam at the surface of the workpiece 101. In certain embodiments, the frequency and longitudinal spacing between turns of the coil are configured to match a mean velocity of the digital beam.

Bunching charged particles allows write strategy optimization with dose variations at the charged particle level by varying the beam buncher frequency, amplitude, and duty cycle, which in turn varies the charged particle density, as described above. The beam buncher parameters are therefore preferably adjusted according to the write strategy.

In certain embodiments, the beam digitizer 206 comprises a beam blanker (e.g., a beam blanker that can operate at speeds sufficient to create a digital beam). For example and without limitation, the high speed blanker may comprise an aperture plate configured to absorb the charged particle beam at certain intervals. The aperture plate is initially positioned such that the stream flows through the aperture in the aperture plate proximate to an interior edge of the aperture plate. An electrode is configured to deflect the stream into the aperture plate, which intercepts the flow of particles to create a temporally and spatially resolved digital beam. FIG. 3D schematically depicts a stream of charged particles traveling through a high speed blanker. An aperture plate 316 is positioned proximate to the stream of charged particles. The electrodes 312, 314 are configured to apply a potential to the charged particle stream to create temporally and spatially resolved groups of charged particles of the digital beam. If unaltered thereafter, the charged particles continue to travel with length L and separation D regardless of how far the charged particles have traveled after passing through the high speed blanker.

Other embodiments of the beam digitizer 206 are also possible. In some embodiments, the beam digitizer 206 is configured to modulate an on/off state of the charged particle source 202. In some embodiments, the beam digitizer 206 is configured to modulate a position of the charged particle source 202 longitudinal to the axis so as to displace the groups of charged particles.

In some embodiments, the beam digitizer 206 is configured to apply electromagnetic radiation, for example with a frequency of between about 1 megahertz (MHz) and 100 gigahertz (GHz) or between about 1 MHz and 25 GHz. In such an embodiment, the beam digitizer 206 can be configured to modulate, for example, the amplitude of the electromagnetic radiation, the frequency of the electromagnetic radiation, combinations thereof, and the like. In some embodiments, the beam digitizer 206 is configured to apply a beat wave to a plasma comprising the charged particles. In some embodiments, the beam digitizer 206 is configured to apply space charges to wake fields. In such embodiments, the beam digitizer 206 can be configured to resonantly absorb the space charges. In some embodiments, the beam digitizer 206 is configured to blank the beam through an absorption aperture. In some embodiments, the beam digitizer 206 is configured to apply a pulsed incident neutralizing beam to the charged particle source 202. In some embodiments, the beam digitizer 206 is configured to apply a pulsed laser beam to the charged particle source 202.

In certain embodiments, components described herein are advantageously combined. In an embodiment, the column 200 comprises a beam blanker downstream of the collimator 204 and a beam buncher downstream of the beam blanker. A digital beam coming from the beam blanker and into the beam buncher can be used to further temporally and spatially resolve the individual groups in the digital beam. In another embodiment, the column 200 comprises a beam buncher downstream of the collimator 204 and a beam blanker downstream of the beam buncher. Other configurations are also possible.

The column 200 further comprises a deflector 210 downstream of the beam digitizer 206. The deflector 210 comprises a series of deflection stages (e.g., electrode stages, magnetic stages) disposed longitudinally along the axis of the digital beam. The deflector 210 deflects individual groups of charged particles in the digital beam. As used herein, the phrase "minor field deflection" refers to the deflection of an individual group of charged particles by the deflector 210. In some embodiments, the deflector 210 is configured to deflect the groups in the digital beam substantially perpendicularly to the axis of propagation. In certain embodiments, the deflector comprises between about 1 and 1,000 or four deflection stages. In certain embodiments, the deflector comprises at least one, two, three, or four deflection stages. In some embodiments, each deflection stage comprises two or more electrodes. In some embodiments, one or more deflection stage comprises four electrodes. Other quantities of deflection stages and electrodes are also possible.

In certain embodiments, an average or mean velocity of the groups of charged particles in a digital beam is between about $1 \times 10^4$ meters/second (m/s) and $3 \times 10^8$ m/s. In some embodiments, application of potentials by each of the deflection electrode stages is adapted to be synchronized with the mean velocity of the groups of charged particles passing through the deflector. For example, a deflection electrode stage may be adapted to apply a voltage only when a group of charged particles is passing through the deflector in general and through that particular deflection electrode stage in particular. In some embodiments, application potentials by each of the deflection electrode stages is adapted to be harmonically synchronized with a mean velocity of the groups of charged particles passing through the deflector. For example, each deflection electrode stage in at least a portion of the deflector may be adapted to apply a voltage only when a particular group of charged particles is passing through the deflector in general and through that particular deflection electrode stage in particular. In some embodiments, application of potentials by each of the deflection electrode stages is adapted to be randomly synchronized with a mean velocity of the groups of charged particles passing through the deflector. As used herein, the phrase randomly synchronized is to be given its broadest possible meaning including, but not limited to, synchronization of application of voltage by the deflection electrode stages to groups of charged particles with random spacing or synchronization of application of voltage by random deflection electrode stages to groups of charged particles with random or other spacing.

In certain embodiments, electrodes of the deflection stage apply a substantially equal voltage potential as each group of charged particles of the digital beam passes. The amount of deflection of each group of charged particles depends on the number of electrodes activated sequentially. In some embodiments, variable potentials are applied to each deflection electrode stage as each group of charged particles passes. For example, the first deflection electrode stage has the smallest voltage with subsequent electrodes have progressively more voltage, resulting in a linear deflection as electrodes are activated. The converse is also possible, where the first deflection electrode stage has the largest voltage with subsequent electrodes having progressively less voltage. The number of deflection electrode stages activated defines the amount of deflection of each group of charged particles of the digital beam. The signal timing and nominal voltages applied to the deflector can be calibrated for individual deflection electrode stages and even individual electrodes within each deflection electrode stage. Triggering an applied voltage of individual deflection electrode stages can be delayed if needed to match the incidence of to each group of charged particles of the digital beam ("phase-matching"), for example due to changes in charged particle velocity, species, and mass, deflection stage position, pattern resolution, pattern field errors, errors within an objective deflection field, process specific compensation and write strategies, combinations thereof, and the like. In certain embodiments, a field perimeter of the deflection electrode stages is defined as the minor deflection field of less then 4 mm, less than 2 mm, less than 1 mm, or less than 100 µm displacement in x or y from the center of the axis of propagation.

In certain embodiments, the potentials of each of the deflection electrode stages are adapted to partially displace the groups of charged particles towards an intended trajectory. Each group is partially deflected 1/Nth of an intended deflection distance by each of a number N of deflection electrode stages. In certain embodiments, the first deflection electrode stage, or any single deflection electrode stage, is adapted to substantially fully displace one or more (e.g., all) groups of charged particles towards an intended trajectory, and the other deflection electrode stages are used to fine tune the deflection of the groups. Other combinations are also possible.

In some embodiments, for example the harmonically synchronized deflector described above, at least a portion of the deflector comprises N sets of deflection electrode stages, each set of deflection electrode stage comprising N deflection electrodes, in which every Nth deflection electrode stage is configured to displace a particular group of charged particles towards an intended trajectory. If at least a portion of the deflector comprises two sets of deflection electrode stages, every other deflection electrode stage in the sets of deflection electrode stages may be configured to displace a particular group of charged particles towards an intended trajectory. If at least a portion of the deflector comprises three sets of deflection electrode stages, every third deflection electrode stage in the sets of deflection electrode stages may be configured to displace a particular group of charged particles towards an intended trajectory. Other variations and configurations are possible.

Figure 6:
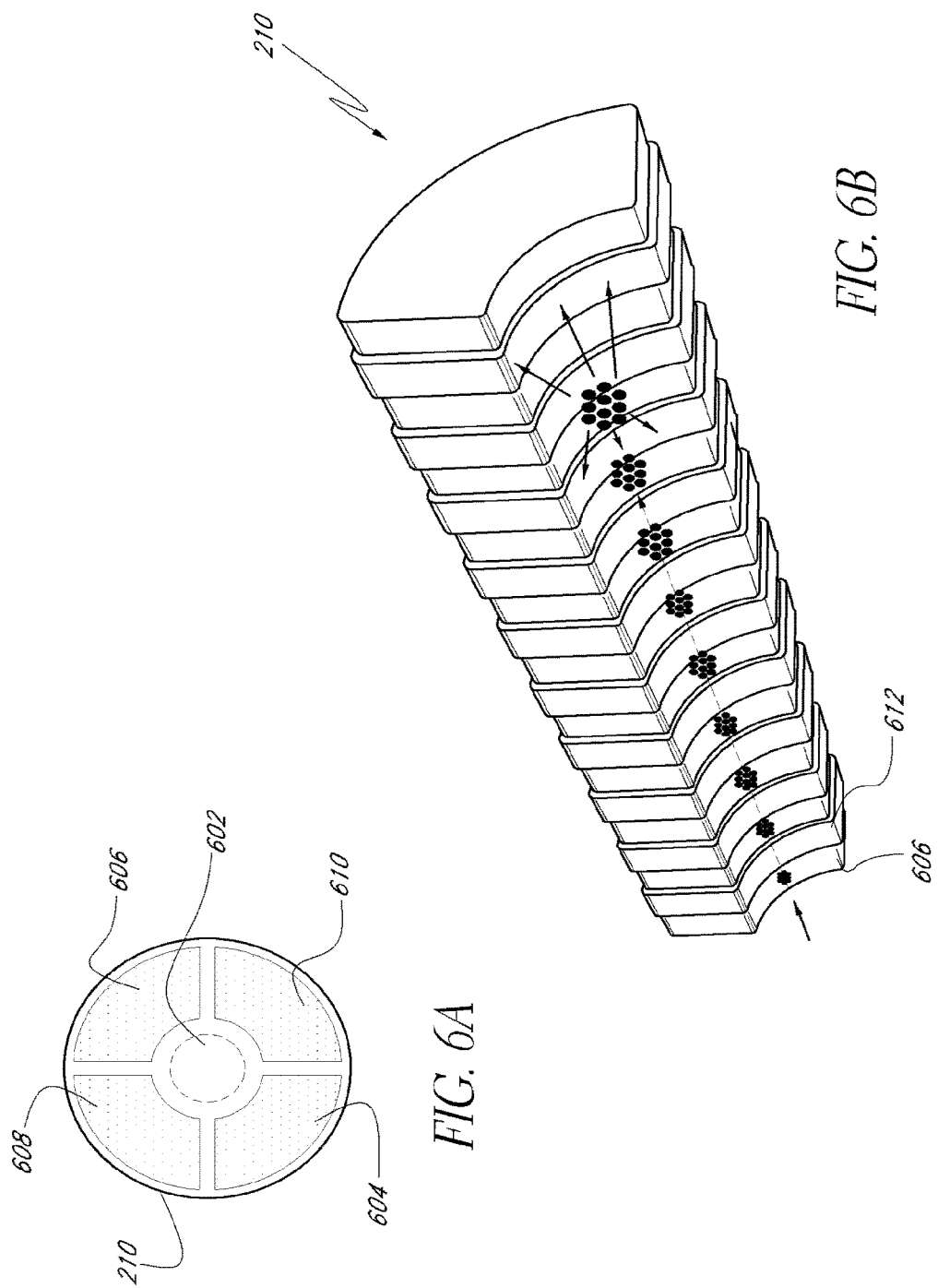
FIG. 6A depicts a top schematic view of a deflector.
FIG. 6B is a perspective quarter cut-away view of the upper right quadrant of the deflector of FIG. 6A.

FIG. 6A depicts a top schematic view of a deflector 210 comprising at least one electrode in each deflection electrode stage. The digital beam comprising charged particles is configured to flow through the center aperture of the deflector 602. The sets of electrodes 604, 606 and 608, 610 may be positively or negatively charged such groups of charged particles are deflected perpendicularly to the longitudinal axis of the deflector and the path. Preferably, the electrodes on opposing sides, for instance, electrodes 604 and 606, are oppositely charged. FIG. 6B is a perspective quarter cut-away view of the upper right quadrant of the deflector 210. The electrodes 606 are separated in this embodiment by an insulator 612. Examples of insulator materials include $SiO_2$, $SiN_x$, $SiO_xN_y$, combinations thereof, and the like. It will be understood that rather than a single deflector comprising a plurality of deflection electrode stages, the deflector 210 may comprise a series of deflectors, each comprising one or more deflection electrode stages. For example, a deflector 210 may comprise three sets of deflectors. As illustrated in FIG. 6B, the groups of charged particles are deflected by each deflection electrode stage as they travel along the path. Other deflector and electrode configurations are possible.

Figure 7:
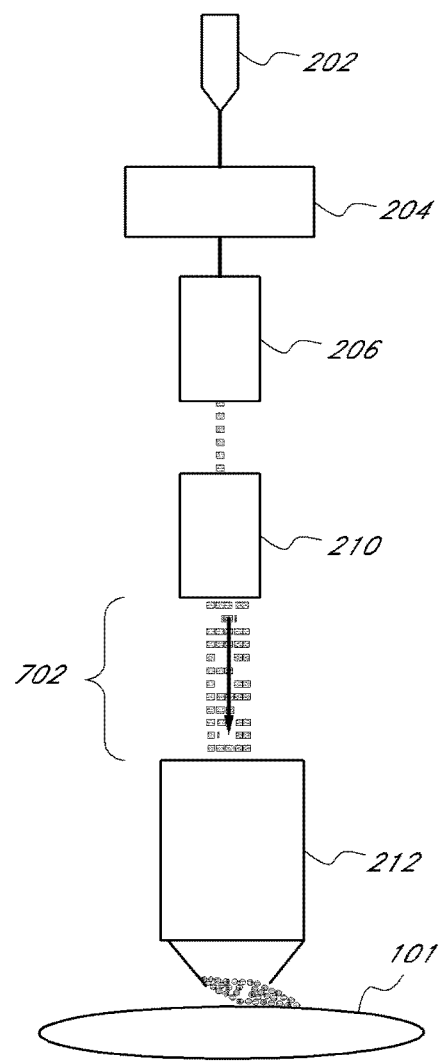
FIG. 7 is a schematic block diagram of another example charge particle column.

In certain embodiments, the deflector 210 is configured to arrange the groups of charged particles into a three-dimensional timespace (an "adaptable virtual digital stencil"). In certain embodiments, the deflector 210 is adapted to create a laterally distributed pattern of the groups of charged particles. In some embodiments, the deflector 210 further comprises a deflector lens adapted to demagnify the pattern or the virtual stencil. The deflector lens may comprise an electrostatic lens, an electromagnetic lens, a reflective lens, a combination reflective and refractive lens, a combination reflective and deflective lens, a combination deflective and refractive lens, combinations of the same, and the like. FIG. 7 is a schematic block diagram of a column 200 in which the groups of charged particles coming out of the deflector 210 are arranged in a virtual digital stencil 702, each group of charged particles having undergone a minor field deflection. The objective lens assembly 212 is configured to deflect the virtual stencil with a major field deflection. The combination of minor field deflection, major field deflection, and movement of the workpiece 101 can be used to expose a pattern of charged particles on the workpiece 101.

In certain embodiments, a phase of the groups of charged particles of the digital beam longitudinal to the axis is configured to be substantially equal, single harmonic, multiple harmonic, random, combinations thereof, and the like. The spacing between the deflection stages may be adapted to be synchronized and to be in phase with the groups of charged particles. In some embodiments, longitudinal positions of the deflection electrode stages are adjustable. In some embodiments, the deflector 210 comprises a digital feedback system, for example to adjust the spacing between the deflection electrode stages. Piezos, etc. may be used to position the electrodes or deflection stages.

In some embodiments, the column 200 further comprises an objective lens assembly 212 disposed between the deflector 210 and the workpiece stage 214. The objective 212 may comprise a lens, a mirror, a reflective optic, a combination reflective optic and refractive lens, a combination reflective optic and deflection electrodes, a combination deflection electrode and refractive lens, combinations of the same, and the like. In some embodiments, the objective lens assembly 212 comprises a detractive lens assembly or a deflector electrode assembly configured to demagnify, focus, and/or deflect the groups of charged particles or the adaptable virtual digital stencil. For example, in certain embodiments and without limitation, groups of charged particles having a diameter (or "spot size") of about 200 nm are reduced 10 times to a diameter of about 20 nm. The objective lens assembly 212 may also be adapted to demagnify the groups or the stencil by 100 times or 1,000 times. In embodiments in which the objective lens assembly 212 is configured to deflect a virtual digital stencil, the deflection may be called a "major field" deflection. In some embodiments, a field perimeter of the objective lens assembly 212 is defined as the major deflection field of less then 10 mm, less than 5 mm, less than 1 mm, or less than 100 μm displacement in x or y from the center of the axis of propagation. In certain embodiments, the exit aperture comprises an exit aperture.

Referring again to FIG. 2, the exposure chamber 102 comprises a workpiece stage 214 downstream of the lower objective lens assembly 212. The workpiece stage 214 is configured to hold the workpiece 101. Preferably, the workpiece stage 214 comprises an interferometric stage, wherein the relative position of the stage is measured using optical interference. The workpiece stage 214 may be thermally controlled to reduce magnification errors in the workpiece, which can lead to overlay errors. The workpiece stage is preferably configured to continuously move while a workpiece 101 is exposed to the groups of charged particles. For example, the workpiece stage 214 may be configured to move continuously over a dimension of 25 centimeters over a period of 1 second during exposing. For another example, the workpiece stage may be configured to move without stopping for more than 5 nanoseconds per 0.5 seconds during exposing. The ability to continuously expose while moving the workpiece stage 214 without stopping can yield increase efficiency and throughput.

In certain embodiments, the workpiece stage 214 comprises an interferometer configured to determine the location of the workpiece stage 214 in a horizontal plane. The relative x/y position of the stage can be measured using optical interference. Other methods are also possible, for example the workpiece stage may comprise a registration mark, grid, or feature detectable by a secondary ion mass spectrometer (SIMS), backscattered electronics, or faraday cup disposed below the registration grid. The registration mark is preferably included in an assembly that can be moved parallel to the column 200 in order to optimize a working height of the registration mark to the workpiece, thereby reducing column calibration and registration errors. The digital beam may periodically or randomly be directed towards the registration mark to check the alignment of the column. The registration mark may also be used to calibrate the column 200 before, after, and/or during exposing a workpiece.

In some embodiments, the chamber 102 further comprises a height control system that measures the height of the workpiece stage 214 and/or a registration mark. The height control system can include, for example, a laser and a plurality of detectors configured to receive light emitted from the laser and reflected by the workpiece, the workpiece stage 214, and/or a surface that moves with the workpiece. The height control system can compensate for variation in the measured height of the workpiece stage by adjusting an elevation of the stage, for example by using electrostatic clamps, piezoelectric devices, etc. In some embodiments, the height control system is configured to compensate for height variations of less than 1 μm. Electrostatic clamping may be used to secure the workpiece to the workpiece stage 214 and to ensure adequate thermal contact and flatness of the workpiece.

Full motion writing (FMW) can eliminate the workpiece stage motion overhead time while exposing a workpiece. In FMW, the deflector 210 system is updated in real time to track the motion of the workpiece stage 214, thereby allowing the system to write patterns while the workpiece stage is in motion. Such a process preferably uses a high speed optical controller (e.g., laser) to track the position of the workpiece stage 214. For example, circuitry on the controller can convert Doppler-shifted laser deflection measurements into laser pulses that can be stored in a stage position register. Interferometry, laser deflection measurements, or other optical techniques can be used to track the position of the workpiece. Therefore, the throughput of lithography systems can be improved by reducing or eliminating nonexposure time during stage repositioning and settling sequences.

While exposing a workpiece, each deflection field center is defined by a window of opportunity (WOO). While the workpiece stage is in motion and a deflection field passes over an unwritten WOO, a stage controller signals a deflection controller to initiate exposure. The workpiece is exposed while the undeflected beam center passes through the WOO. Within the WOO, the deflection system can deflect to the outer limit of the field. During this time, the deflection system is updated by the workpiece stage position register of the actual location of the workpiece stage.

Figure 4B:
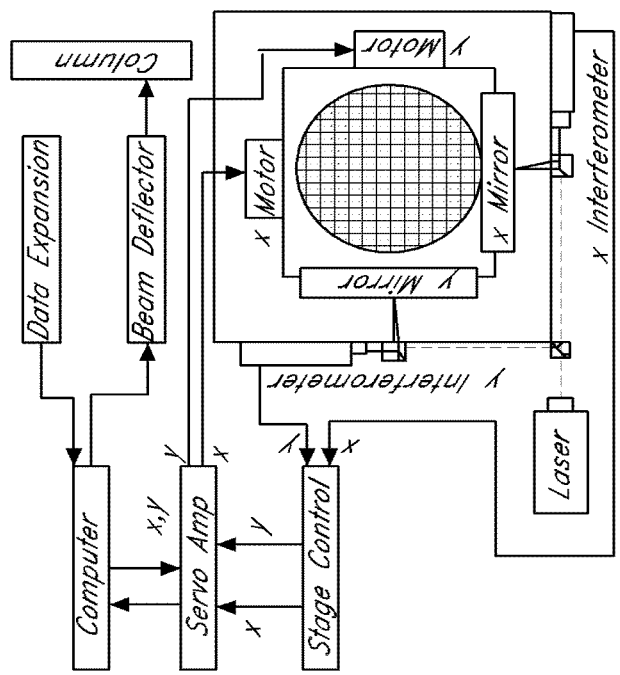
FIG. 4B is a schematic block diagram of an example workpiece stage and control electronics.
Figure 4A:
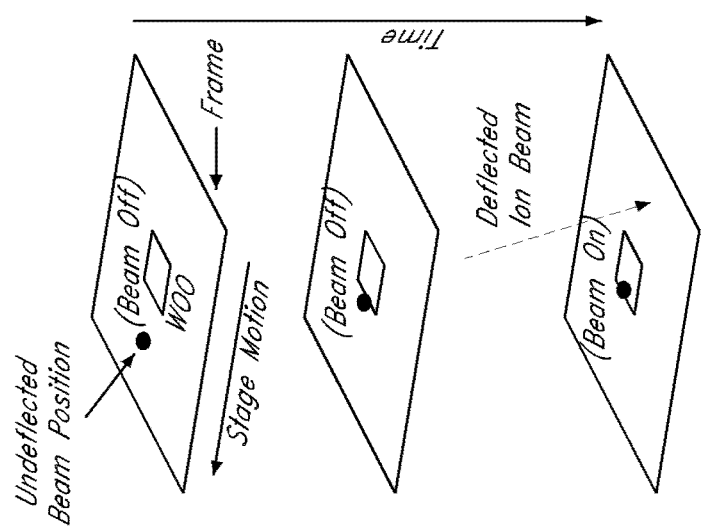
FIG. 4A illustrates an example writing strategy over a period of time.

The workpiece stage can allow real time deflection correction. By changing the WOO size or frame size, or by smoothing the frame-by frame pattern data, the system can be dynamically optimized for continuous writing. A typical frame/WOO density is depicted in FIG. 4A.

The workpiece stage may be configured to provide suitable velocity performance, for example at 100 centimeters per second. The workpiece stage may be configured to rotate a workpiece during exposure at up to about 40,000 rotations per minute (rpm). For example, the workpiece stage may have as little inertia as possible, and a compatible workpiece stage motor design can be provided. The use of vacuum compatible air bearing rails and linear motor drives can provide adequate decoupling of vibration sources. As additional examples, the workpiece stage motors can be placed in the vacuum system, light weight materials can be used for the workpiece stage, and the workpiece can be aligned on the stage, thereby eliminating the workpiece cassette and cassette clamping hardware. Additionally, the first three derivatives of stage position (velocity, acceleration, and jerk) can be limited and damped by electronic hardware to properly control the motion of the workpiece stage. FIG. 4B is a schematic diagram of an example workpiece stage and control electronics.

The exposure chamber 102 may be in communication with control electronics, for example system support electronics 220 including wafer handler control, vacuum control, suspension control, temperature control, pressure control, etc. and column support electronics 230 including a source control module, digitizer control, deflector control, lens control, wafer height sensor, video processor, stage control, and a dynamic corrector (e.g., for real time column aberration correction). The column support electronics 230 may be in communication with data process electronics 240, for example a workstation.

An example application of the systems described herein is to perform in situ workpiece processing or resist exposure by directly writing on the workpiece. Preferably, accurate registration of optics to the target workpiece is achieved, but tool induced shift (TIS) and workpiece induced shift (WIS) errors may be introduced due to temperature effects, workpiece processing effects, and optical distortions. An example solution is to measure an initial pattern (e.g., one or more alignment marks) on the workpiece is and to use the measurement data to accurately place a newly patterned image onto the workpiece, for example by adjusting the exposure parameters.

A registration sensor preferably can automatically detect and recognize a variety of registration and alignment mark patterns, materials, and profiles without impacting the quality of exposure throughput. Examples to achieve such a sensor include, but are not limited to, using a high resolution, high speed registration system with existing hardware, determine the limitation and flexibility of the registration strategy (e.g., by mapping the workpiece with die-to-die registration) and the incorporating a temperature conditioning stage, and introducing a high speed moiré (grating) interferometer system for die-to-die registration, combinations thereof, and the like. Other approaches are also possible.

A high resolution, high speed registration system can employ existing hardware and can be similar to existing electron beam registration, but a plurality of imaging modes can be used. Scanning the surface of an object (e.g., a registration or alignment mark) with a digital beam produces secondary electron emission, secondary ion emission, and ion sputtering. A bi-axial or cylindrical microchannel plate can be used to detect both secondary electrons (e.g., by biasing above the voltage of the target) and the secondary ions (e.g., by biasing below the voltage of the target). Other configurations are also possible. An image can be created by measuring a signal yield of the secondary ions and secondary electrons at each point where the beam impacts the target. Variations in the yield indicate changes in surface topology or composition of the workpiece. The position resolution of this signal is a product of the measured beam spot size and deflection pixel size during registration and is augmented by statistical metrology. Sputtered ions provide greater mark recognition ability because such ions can be collected and mass analyzed secondary ion mass spectroscopy (SIMS). SIMS registration techniques are well developed and can be used both for mark detection and for process development diagnostics. An atomic map with the spatial resolution of the beam spot size can provide excellent precision for mark detection.

To optimize registration, a product summation of the detector video signal with a computer generated image of the registration or alignment mark can be used to enhance or recover an otherwise unrecognizable target signal from high-noise background. This can be performed by automatically correlating the video gain and bias offset for an initial signal enhancement. Once the tone is properly adjusted, the signal can be correlated with a computer generated (CAD) image of the registration or alignment mark to provide an enhanced image of the mark. Other signals are detectable from digital beam mark interaction. Signals such as those from secondary electrons and backscatter electrons may be used for this process. Additionally, signals from secondary electrons and backscatter electron may be employed differentially to improve detection limits (e.g., signal to noise ratios). For example, the final detection signal may be the difference between SIMS and other signals. The speed of registration may be limited by the quality of the registration electronics, but incorporating modern electronics (e.g., digital signal processing (DSP)) may reduce the registration time by orders of magnitude without burdening registration resolution.

Another consideration in the quality and speed of registration is the configuration used to register to the workpiece prior to exposing. Depending on the pre-conditioned and in-process temperature stability of the workpiece, several strategies are available to compensate for distortions and throughput issues. Workpiece mapping generally registers a single die, providing reduced or minimum overhead to the system throughput but no correction for pattern distortion caused by temperature instability during exposing. Die-to-die registration performed immediately prior to die exposure, for example to minimize temperature distortion effects, generally uses four registrations per die per level. Such a technique eliminates the ability to write in a serpentine mode, drastically limiting the throughput of the system by memory load overhead time. However, performing registration on a plurality of dies at one time can maintain the ability to write in a serpentine mode within a field comprising the plurality of dies, thereby allowing increased or maximum throughput while reducing or minimizing pattern distortion.

Overlay accuracy becomes increasingly important as device geometries shrink. For a digital beam tool, the direct exposure of multi-level patterns on a single workpiece for manufacturing of integrated circuits desirably includes accurate intra-layer registration. An example workpiece alignment technique has three features: adequate signal generation from the surface impact of the digital beam; a detection algorithm for processing the detected signal; and an alignment feature fabrication technique.

The impact of a charged particle onto the workpiece can create media such as secondary electrons, backscattered electrons, photons, and secondary ions, each having certain advantages in detection efficiency. However, selection of a particular media for registration purposes depends on the charged particle species, the charged particle energy, and the current density of the beam. A signal detector may be optimized for a given media. For example, an electron-photomultiplier is generally appropriate for secondary electrons, a solid state diode is generally appropriate for backscattered electrons, and secondary ion mass detectors are generally appropriate for photons and secondary ions.

A digital signal processor processes information from the signal detector in order to determine the location of the alignment mark. A traditional method of detection includes a one-dimensional line scan with the digital beam. As the digital beam transitions by deflection across the alignment mark, the detected video signal is modulated. Modulation occurs because differences in the alignment mark and the contour of the workpiece. Actual alignment mark location can be determined by processing the distribution of the modulated signal via a digital signal processing module. Another detection method includes an X/Y scanning mode of the digital beam to acquire a video image of the alignment mark. To achieve accurate edge detection, digital signal processing algorithms are applied. Improved detection of the alignment feature edge is accomplished through a two-dimensional imaging method that averages several frames of video data and determines the actual location of the alignment mark by gray scale signal processing.

Preferably, alignment marks are formed over the entire working area of the workpiece in the form of equally spaced two-dimensional grids. One construction method is the formation of a raised multi-layered semiconductor structure consisting of layers of silicon, silicon dioxide ($SiO_2$), and polysilicon, with an alignment mark formed on the polysilicon layer of the wafer. In another construction method, an alignment mark is etched into the surface of a silicon wafer and a layer of a heavy metal (e.g., tantalum or tungsten) is deposited into the trench. The alignment mark containing the heavy metal exhibit a high level of backscatter relative to a silicon substrate, thereby providing contour details for low energy backscatter ion detection. Selection of an appropriate alignment feature construction method depends on the signal media and the signal detector, dictated by process steps.

A minimum of three alignment marks are preferred in order to accurately identify translation, rotation, and magnification errors. The measured errors are fed back to the workpiece stage control system for correction, thereby reducing workpiece and tool induced shift errors. The processing of global alignment marks may permit faster and more accurate detection of localized alignment marks by removing gross errors. The alignment process can be repeated whenever the workpiece is inserted into the exposure chamber, whenever the workpiece is removed from the apparatus, between significant process steps, etc. Other techniques can also be used.

Patterning tools transfer large quantities of microelectronic circuit pattern data in a format that can be manipulated (e.g., converted from digital to analog) within small periods of time (e.g., nanoseconds). The data is typically in a format for very large scale integration (VLSI) computer aided design (CAD), as described below. This data is used, for example, to control the deflection by the deflector 210, the deflector lens, the objective lens 212, and/or movement of the workpiece stage 214 and can be adjusted to address aberrations in the optics. Charged particle exposure chambers may have imperfections (e.g., aberration, deflection errors), for example due to manufacturing or installation imperfections and the physical constraints of the optics. As an example, if a system is installed with a slight rotation relative to the workpiece stage 214, beam deflections will be rotated relative to the motion of the workpiece stage 214. More complex errors may also be present; for example, an attempt to trace the outline of a large square with the beam may produce a pincushion or barrel shaped pattern. The magnitude of these effects is proportional to the magnitude of deflection of the digital beam, which can limit the size of the deflection field and can create nonlinear distortions in system writing quality. High resolution writing using a digital beam is therefore preferably able to augment transformed pattern data to compensate for deflection field distortion, wafer distorted pattern placement errors, stage position, etc.

Additionally, processing errors may be introduced. Pattern distortion or deflection distortion can result from several factors when exposing a workpiece with a digital beam. For example, thermal fluctuations in the exposure chamber 102 or in a workpiece 101 can cause magnification errors. For another example, securely clamping the workpiece 101 to the workpiece stage 214 can also cause rotational errors or can induce stresses resulting in pattern sheering. For yet another example, unrecoverable nonlinear pattern distortions can result from subsequent processing such as rapid thermal annealing. For still another example, manufacturing or installation of the optics may be imperfect (e.g., with a slight rotation relative to the workpiece stage) and the optics have certain physical constraints. More complex errors may be introduced by certain processes, for example and without limitation, tracing a large square with the digital beam may result in a pincushion or barrel shaped pattern. The magnitude of the errors may be proportional to the magnitude of the beam deflection such that they can limit the size of the deflection field and can create nonlinear distortions in system writing quality. The adaptable virtual digital stencil is in softcode at any given point in time. As such, the stencil is temporally and spatially adaptable to correct in real time for nonlinear pattern offset, gain, rotation, and corrections within the minor field, while being deflected in the major field. These corrections can be performed within features, die, or to the entire workpiece.

Digital beam lithography systems preferably can perform pattern and beam corrections to compensate for processing-induced errors on the workpiece and optical errors (e.g., coma distortion, astigmatism, image pure distortion, chromatic aberration, spherical aberration, field curvature, etc.). Such corrections can improve writing quality and enhance system throughput.

Figure 4C:
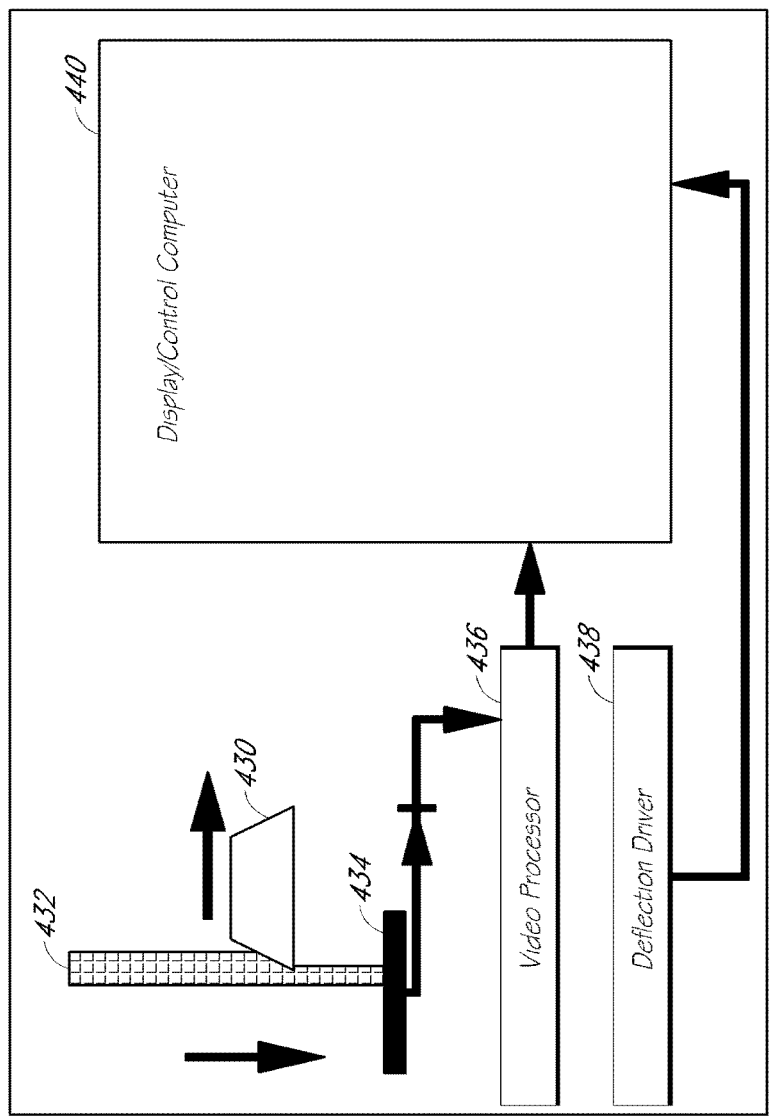
FIGS. 4C and 4D is a schematic block diagram illustrating an example beam measurement technique.
Figure 4D:
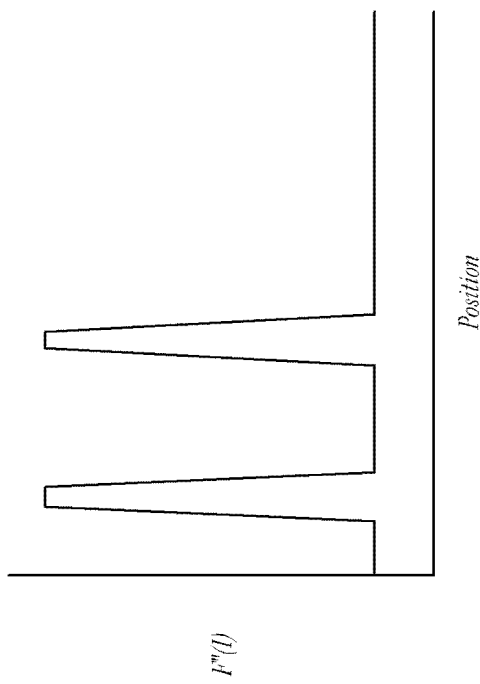

Pattern and deflection distortion problems can be corrected by incorporating data manipulation bias electronics (hardware and software) into the system. For example, process control software can use metrology measurements to correct the deflection of the digital beam. Such metrology measurements preferably are made prior to exposing the workpiece. The quality of the digital beam may initially be optimized to provide improved or optimum measurements from subsequent metrology. In some embodiments (e.g., as depicted by FIG. 4C), a knife-edged micromesh grid is placed over a diode detector, which is scanned by the digital beam. The second derivative of the beam current with respect to the scan position provides a high resolution beam profile (e.g., as depicted by FIG. 4D). Optimization (e.g., automated optimization) of the beam profile with the optics control system allows focusing of the beam.

Once the digital beam has been optimized at small or minimum deflection angles, the system can correct the digital beam profile within a larger usable deflection field by moving the workpiece stage 214 to a plurality of positions within the outer limits of the distorted deflection field. The digital beam is then deflected to the position where the grid is scanned for beam optimization. The sequence is repeated over an extended size of the deflection field. Beam optimization data can then be correlated with an interferometer or other position monitoring system of the workpiece stage 214. In certain embodiments, the linear contribution of the error is stored as an argument, while the nonlinear error is stored as pure memory. Beam distortions that depend on the position of a minor field within a major field can also be correlated. Within the minor field, use of the grid to calibrate deflection distortions can be performed without moving the workpiece stage by major field deflection of the adaptable virtual digital stencil to fit the scans on the grid. As a result, automated optimization or improvement of the beam profile can be performed within an extended deflection system, thereby allowing improved writing quality and throughput performance.

A final measurement can be made prior to exposing portions (e.g., individual dies) of the workpiece 101 because the workpiece 101 may be rotated or distorted as a result of temperature or stress effects caused by processing. If a pattern is being written on a workpiece 101 that already contains previous pattern levels, the new level can be adjusted to overlay on the previous levels, for example by registering to three or four corners of the die and then applying a magnification or rotational correction within each die. For example, the calibration software may automatically measure features on the edges of each die prior to exposure and use the measurements to correct for any pattern displacement, magnification, or rotation caused while aligning, processing, or handling the workpiece.

As described above, the exposure chamber 102 can be operated by providing integrated circuit (IC) design data, for example in the form of CAD schematics, to generate and expose the pattern on the workpiece. Users of the apparatus 100 input a desired pattern to be written, along any specific alignment configurations and/or processing parameters. Once the design for a device (e.g., an integrated circuit) is developed, multiple pattern layers of the design can be laid out to cover the workpiece as desired (e.g., to cover the entire workpiece). A complete exposure data preparation (EDP) package with a user interface can be used to convert raw designs (e.g., in CAD or graphic data system (GDSII)) to a format usable by the exposure chamber 102 (e.g., exposure ready format (ERF)). Prior to loading pattern data onto the system, several format changes, such as compressing and merging similar pattern features and reducing overlapping routines, can be made to increase or maximize throughput of the exposure chamber. Once the pattern data has been compressed to a reduced or minimum size, a field partition routine can define the major and minor deflection fields of the pattern data and use a smoothing routine to normalize the density in each data frame. Normalization reduces stage jerking when writing repetitious adjacent multiple density patterns. After registration as described above, the pattern is laid out on the workpiece, using the registration data to calibrate the intended beam pattern to the actual workpiece pattern and to apply any compensation to improve overlay accuracy.

In various embodiments, for example pattern data in GDSII, OASIS, or other suitable formats is input into the system. The input data is then fractured into subfields and identified as to whether they are to be "written" or "non-written." The mapping of the written subfields is sent to a data path module for rasterization (e.g., conversion to a bitmap). Throughput improvement is achieved by moving the workpiece stage and deflecting the beam from one written subfield to a non-adjacent written subfield without exposing non-written subfields. No time is spent processing non-written subfields without pattern data.

Various deflection technologies can be used to expose a workpiece to charged particles. Raster scan is a scanning mode in which the beam moves back and forth over the entire workpiece; the beam is turned on over designated areas and is turned off until the next designated area. Vector scan is a scanning mode in which the digital beam scans only selected areas where pattern is to be placed; after scanning of the selected area is completed, the beam is turned off and moved to selected area to be scanned. Hybrid vector-raster technology utilizes a vector approach for major field deflection between data pattern subfields and uses a raster scan technology to deflect a Gaussian or shaped digital beam within the subfield. Throughput improvement can result from only moving the workpiece stage to positions that receive exposure. Another form of vector-raster includes a vector deflection in the major field, a vector deflection between pattern features within the minor field, and a raster image of the feature within the minor field. The vector capability of a vector-raster system can provide higher throughput versus a pure raster scan system, and the raster capability of the vector-raster system permits good pattern fidelity and high current with a small dwell time.

As described above, in certain preferred embodiments, minor field deflection of the digital beam is accomplished through a deflector, which is possible because that the longitudinal spatial and temporal spacing of the groups of charged particles permits the individual deflection of each group. In certain embodiments, the voltage applied to each deflection electrode stage is timed to match the velocity of each group of charged particles.

Spacing between groups of charged particles can effectively provide blanking. In particular, such blanking between groups effectively uses the full flux of a continuous or nearly continuous charged particle stream. The temporal spacing between groups allows for deflection error correction (error correction signal summing can compensate for stage disposition, deflection aberrations, optical aberrations, and write mode process adjustments). Throughput improvement can be achieved by maximizing the time that the digital beam exposes the workpiece.

In certain preferred embodiments, the digital beam is capable of performing a plurality of pattern exposure strategies. Such strategies may be designed to modify exposure dose, species, pattern quality, beam energy per group of charged particles, beam energy for sets of groups, and beam energy for an adaptable virtual digital stencil. The apparatus may also be capable of discretely modifying exposure dose, species, pattern quality, beam energy per group of charged particles, beam energy for sets of groups, and beam energy for an adaptable virtual digital stencil within a particular writing strategy to optimize that particular writing strategy for a particular process.

Figure 21A:
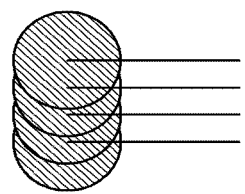
Figure 21B:
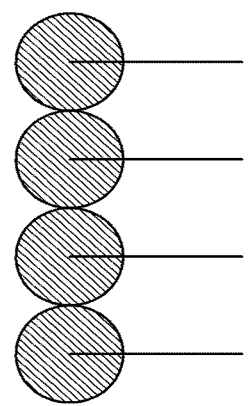

In an embodiment of a writing strategy, the beam is scanned in raster fashion across the entire area of the workpiece. In certain embodiments, the spot size of the beam is greater than the grid spacing in the raster (e.g., as depicted by FIG. 21A). In certain embodiments, the spot size of the beam is substantially equal to the grid spacing in the raster (e.g., as depicted by FIG. 21B). That is, the pattern is vector scanned in the major field, vector scanned in the minor field, and raster scanned in a single pass within the feature to be exposed. Feature processing with a digital beam can leverage the per pixel dose variation to improve feature edge quality when performing etch, implant, and deposition. In some embodiments, a digital beam spot size to pixel ratio greater than one can average placement of the groups of charged particles and can reduce exposure process errors. A large digital beam spot size to pixel ratio improves line edge roughness and allows a higher dose deposition due to cumulative dosing from overlapping beams. This process can also be performed with or without resist.

Figures 21C, 21D:
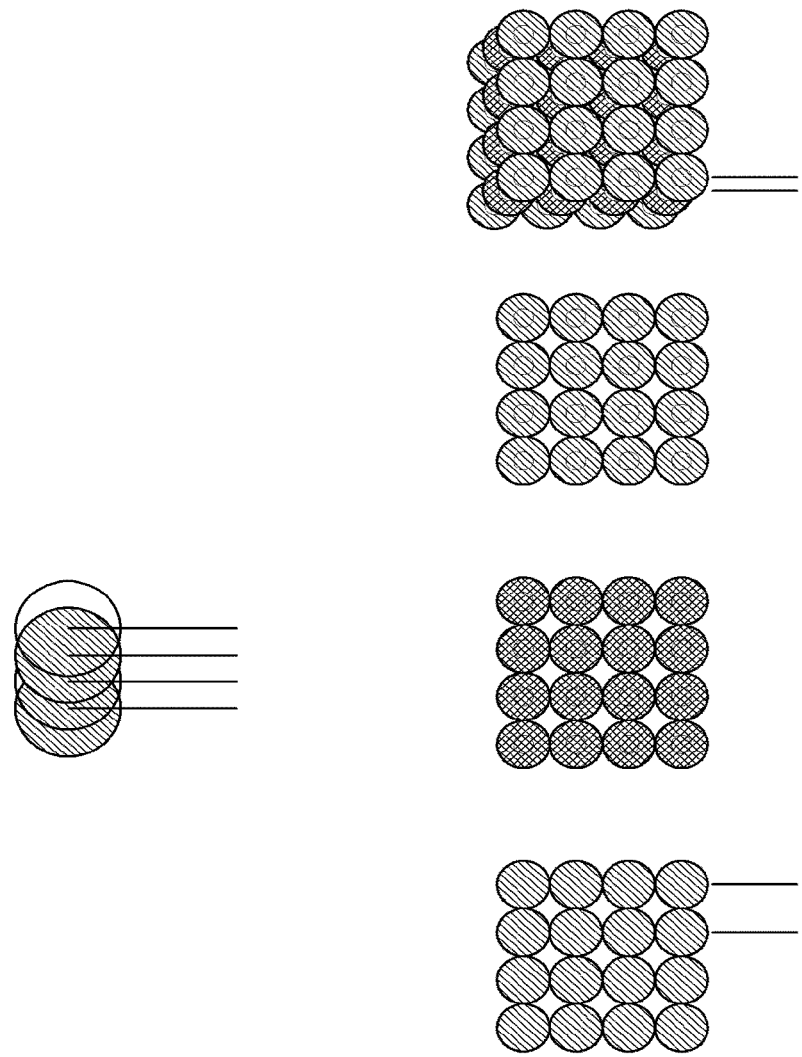

In another embodiment of a writing strategy, alternating row and column exposure is performed with a large spot size and small pixel size ratio. Exposing alternating pixels with a digital beam produces a pixel exposure width half as wide as the selected feature, thereby increasing the feature critical dimension over target value in both axes (e.g., as depicted in FIG. 21C). That is, the pattern is vector scanned in the major field, vector scanned in the minor field, and raster scanned in alternating pixels in both x and y directions with a single pass within the feature to be exposed. Throughput is increased by effectively reducing the number of charged particles per flash, but at the cost of critical dimension control. There are advantages to using this write mode for a digital beam, such as the ability to apply per pixel dose variation or multiple species exposure to improve device performance, feature edge quality, and throughput when performing resistless etch, implant, and deposition processes. The throughput improvement can be dramatic since system throughput increases as the square of the effective writing grid. This process can be performed with or without resist.

Figures 21E, 21F:
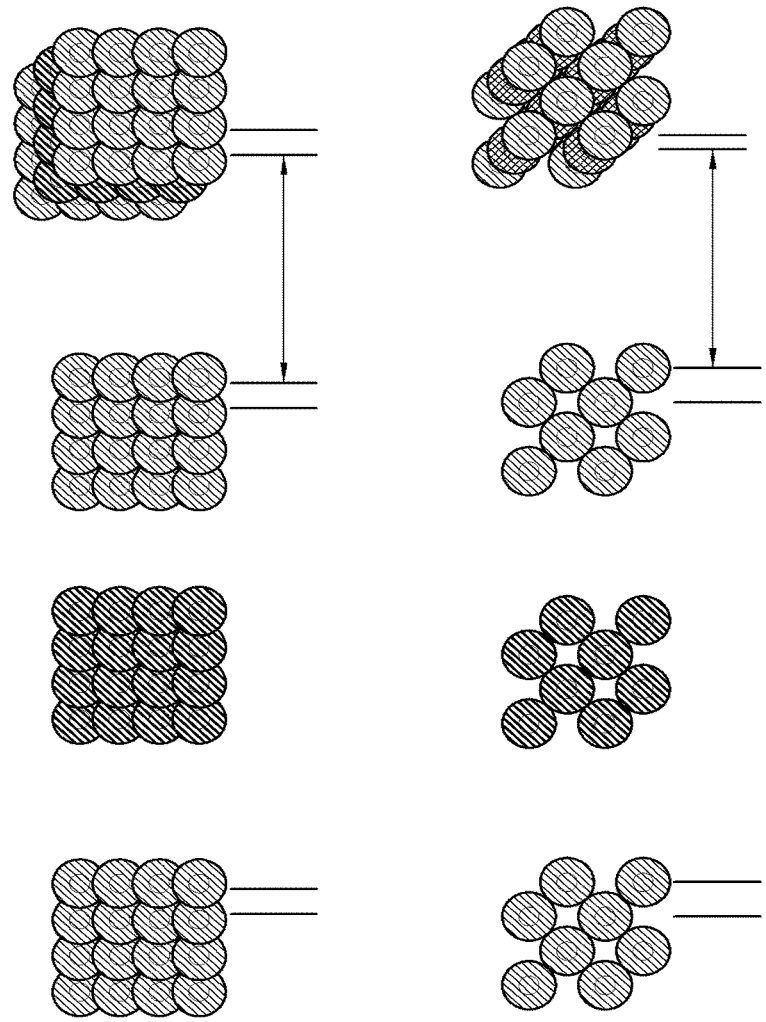

Yet another embodiment of a writing strategy divides pixel spaced matrices (or "composites") and overlays exposure of a combination of composites interleaved in a series of passes, with each pass offset from other passes in both the x and y directions by a fraction of the writing address. That is, the pattern is vector scanned in the major field, vector scanned in the minor field, and raster scanned in a series of passes that interleave the pixels within the feature to be exposed. The beam size can be set 25-100% larger than pixel size in order to average out the flashes and to reduce the number of charged particles per group (e.g., as depicted in FIG. 21D). A larger beam spot size versus pixel size helps reduce line edge roughness by averaging systematic errors to allow a higher dose deposition (e.g., as depicted in FIG. 21E). There are advantages to using this write mode for a digital beam, such as the ability to apply per pixel dose variation to improve feature edge quality when performing direct etch, implant, and deposition processes, thereby improving feature edge quality. This process can also be performed with or without resist. The feature quality is improved, but multiple passes are achieved with little or no effect on throughput.

Yet another embodiment of a writing strategy leverages a sampling matrix having an array of cells of a predetermined input address size. Each pass produces a writing grid defined by the distance between beam placements in a single pass. That is, the pattern is vector scanned in the major field, vector scanned in the minor field, and raster scanned in a series of passes offset in the x and y directions to create multiple offset composite feature patterns that interleave the pixels within the feature to be exposed. The composite of all passes forms the effective exposure grid (e.g., as depicted in FIG. 21F). The dose of the beam can also be freely varied within the operating envelope of the system. There are advantages to using this write mode for a digital beam, such as the ability to apply per pixel dose variation to improve feature edge quality when performing resistless etch, implant, and deposition processes, thereby improving feature edge quality. This process can also be performed with or without resist with a pixel rate greater than about 400 MHz. A good balance between feature quality and throughput can thereby be achieved. The dose of the beam can also be varied within the process-defined operating envelope of the system (e.g., as depicted in FIG. 21G). This can be performed with a number of techniques including modulating the duty cycle of a beam buncher. Multiple levels of pixel intensity are provided from 0% to 100% beam intensity. Pixels of partial intensity are used along the edge of a feature so as to locate the edge between the lines of a Cartesian raster scan grid. The dose modulation can be assigned by the user via the pattern data file. There are advantages to using this write mode for digital beam processing, such as the ability to apply per pixel dose variation to improve feature edge quality when performing resistless etch, implant, and deposition processes, thereby improving feature edge quality. This process can also be performed with or without resist. A good balance between feature quality and throughput can thereby be achieved.

FIG. 8 illustrates an example vector-raster write strategy using a digital beam. The workpiece is divided into square pixels 1 through 44. The beam generally writes in a serpentine motion across the workpiece, from 1 to 4, then from 5 to 12, then from 13 to 22, etc. Each pixel is divided into stripes, and each stripe is divided into fields, which are divided into subfields. The beam generally writes in a serpentine motion across each stripe, field, and subfield as well. Within each subfield, the beam is able to write only where written features exist. Like vector scanning, the digital beam only scans selected areas, but the beam does not need to be turned off to be moved to another area, at least the time the beam is turned off is reduced as the dead space between the groups of charged particles can be used for that purpose.

As device geometries decrease, patterning with accurate overlay is preferably at least one order of magnitude smaller than the minimum or critical dimension. Workpiece processing and handling may induce pattern errors across the workpiece that contribute to placement errors, especially as geometries fall below 0.25 microns. However, serial patterning equipment (e.g., exposure chambers with a digital beam) has the flexibility to correct for these errors by registration and pattern data augmentation. A fully automated metrology program that commands the digital beam to align itself, perform deflection/workpiece positioning calibration, and recognize and correct for wafer pattern distortion can eliminate not only pattern defects at the most recent level, but for other pattern errors, as well.

As previously discussed, beam measurement and laser interferometer systems have accuracies to within a few angstroms. Making use of these measurements, system calibration software can collect the deflection gain, linearity, offset, and rotation for both the major and minor deflection fields. The deflection is calibrated to the laser interferometer system, providing a well-behaved deflection motion and profile of the digital beam within the deflection field. Linear and nonlinear errors of the digital beam profile with respect to the beam deflection can also be measured and corrected. Because each die is registered prior to exposure, temperature compensation can be performed by adding corrections to the pattern software and exposing that die in a corrected state, which allows the system to reduce or eliminate pattern distortions caused by annealing, vacuum radiation drain and evaporation, and improper conditioning.

The flexibility of electronic data preparation (EDP) software allows alterations of the pattern to accommodate processing variability. Pattern editing, tone reversal, and feature biasing provide increased flexibility to the user of the apparatus 100. In addition, feature bordering, dose by size, and dose by type can improve digital beam assisted chemical etching (DBACE) and digital beam nucleation deposition (DBND) at small geometries.

Preferably, a data manipulation bias system corrects for pattern and deflection distortion, for example by augmenting pattern data applying corrected data to the optics control system. The data manipulator system applies final pattern data biasing prior to optics control, and therefore may include very fast electronics (e.g., the fastest electronics in the system). This system sums pattern data correction, deflection distortion correction, and workpiece stage motion correction to the front end of the optics control system. Digital to analog converters at the front end of the optics control system convert the digital signals from the data manipulator. Once amplified, these analog signals drive the column 200.

Overlay accuracy can limit sub-micron lithography. For example, traditional lithography systems cannot correct for nonlinear pattern distortions caused by wafer processing, which is exacerbated by increased workpiece sizes and reduced device geometries. However, certain digital beam systems described herein can advantageously correct for such errors because the pattern is not fixed on a reticle, but can change during exposing. The adaptable virtual digital stencil is in softcode at any given point in time. It is therefore temporally and spatially adaptable to correct in real time for nonlinear pattern offset, gain, rotation, and corrections within the minor field, while being deflected in the major field. These corrections can be performed within features, die, or to the entire wafer.

A method of processing a workpiece 101 in the exposure chamber 102 comprises exposing the workpiece 101 to a digital beam of charged particles. In certain embodiments, exposing the workpiece 101 comprises forming a stream of charged particles, collimating and propagating the steam along an axis, digitizing the stream into a digital beam comprising groups (or packets or flashes) comprising at least one charged particle, deflecting the groups of charged particles using a series of deflection electrode stages disposed longitudinally along the axis, demagnifying the pattern, and focusing the demagnified pattern of groups of charged particles onto the workpiece 101. The dosage of exposure is preferably less than about $1\times10^{17}$ charged particles/cm$^2$. As described above, digitizing the beam may comprise, for example, beam bunching, high speed blanking, combinations thereof, and the like.

In some embodiments, deflecting the groups of charged particles comprises selectively applying voltages across the deflection electrodes at each deflection electrode stage. Selectively applying the voltages may comprise applying a large voltage with a first deflection electrode stage and applying smaller voltages with other deflection electrode stages. Selectively applying the voltages may also comprise applying a small voltage with a first deflection electrode stage and applying larger voltages with other deflection electrode stages. Selectively applying voltages may also comprise applying approximately equal voltages at each deflection electrode stage. Demagnification of the groups of charged particles preferably produces packet diameters of less than about 200 nm, less than about 50 nm, less than about 10 nm, less than about 5 nm, or less than about 1 nm. The workpiece stage may move continuously during the exposing process. For example, the workpiece stage may move continuously over a dimension of about 100 cm over a time period of 1 second. For another example, the workpiece stage may move without stopping for more than 5 nanoseconds per 0.5 seconds.

Figure 5:
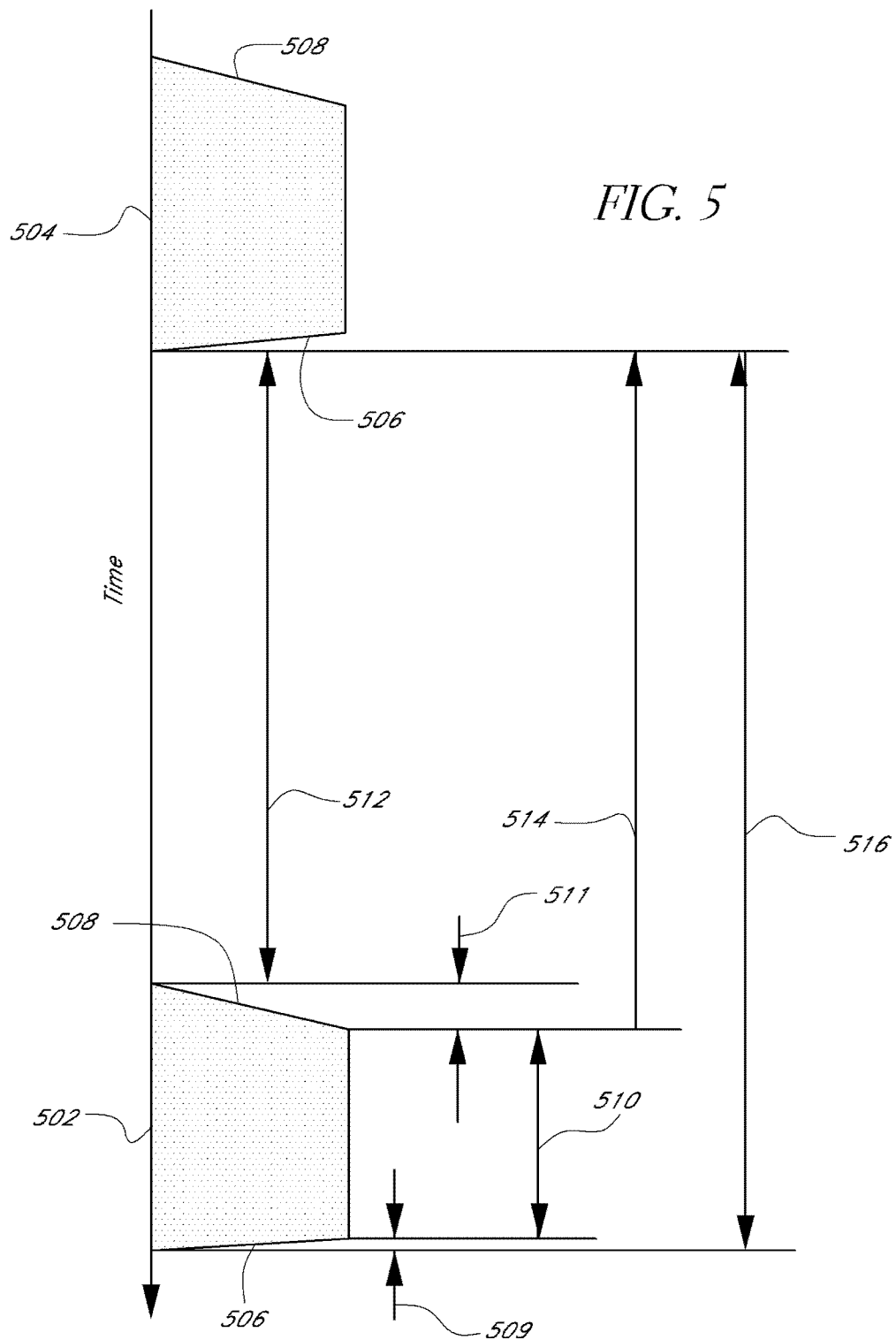
FIG. 5 illustrates example groups of charged particles in a digital beam.

FIG. 5 illustrates a plurality of groups of charged particles 502, 504. In some embodiments, deflection of a group of charged particles occurs during a dead zone 512 at the workpiece such that no exposing occurs during the deflection. The rise time 509 of saturated beam pulses can be used for blank and unblank edges. In some embodiments, the geometry of the groups of charged particles are Gaussian in x and y dimensions perpendicular in time, as well as Gaussian in velocity to, the axis of propagation. In some embodiments (e.g., as depicted in FIG. 5), the groups of charged particles 502, 504 have a trapezoidal cross-section along the longitudinal axis. In FIG. 5, two groups of charged particles 502 and 504 are depicted. Each digital beam has a density distribution rise time 506 and a fall time 508. The time between no charged particles and the peak density of charged particles is the quick pulse rise time 509. The time in which each group 502, 504 has a peak density of charged particles is the digital flash time 510. The time between the full concentration of charged particles and no charged particles is the quick fall time 511. The time in which there are no charged particles is the dead zone 512 (the anti-node region). The time between the last instance of a full concentration of charged particles in a first group, for example the group 502, and the initial concentration of charged particles in a subsequent group, for example the group 504, is the deflection time 514. The time between the first concentration of charged particles in a first group, for example the group 502, and the initial concentration of charged particles for a second subsequent group, for example the group 504, is the flash duty cycle (or "flash spot rate") 516 and is used for feature-to-feature deflection time within the minor field. In some embodiments, however, blanking can occur over multiple duty cycles. A blanker may be used.

Referring again to FIGS. 1A and 1B, the apparatus 100 may further comprise at least one dedicated process chamber 108. Additional process chambers can optionally be used for advanced processing. The process chambers 108 may comprise any variety of workpiece processing equipment. For example, and without limitation, the processing chambers 108 may comprise etch, deposition (e.g., oxidation, nucleation, etc.), rapid thermal anneal (RTA), combinations of the same, and the like. Some process chambers 108 may be configured to process a workpiece 101 that has been exposed in the exposure chamber 102, while other process chambers 108 can be configured to process a workpiece 101 before or after processing in another process chamber 108, before processing in the exposure chamber 108, etc. In certain embodiments, a process chamber 108 does not substantively change the workpiece 101. For example, a process chamber 108 may comprise a calibration or metrology tool. In certain embodiments, the apparatus 100 comprises a plurality of processing chambers 108 such that a workpiece 101 may be transformed from a bare substrate to a substantially finished product. Preferably, workpiece 101 can be fully processed without being removed from the apparatus 100. In certain embodiments, the duration from starting substrate to substantially finished product is less than one week, more preferably less than two days, or even more preferably less than one day, or more preferably yet in less than one hour.

In an example embodiment, two process chambers 108 are dedicated to nucleation and oxidation deposition, a third process chamber 108 is dedicated to rapid thermal annealing, and a fourth process chamber 108 is dedicated to chemically-assisted digital beam etching (CADBE). Although one process chamber 108 may be adapted to perform all such processes, dedication allows, for example, the use robust materials to avoid corrosion in the CADBE chamber.

Automated processing software can be used to monitor and analyze all aspects of the system's performance, to perform automation control of all functional operations, and to optimize each process performed by the system. The software can perform a data gathering routine on all sensors of the system and organize the results into operational and performance related reports addressing the status of the system. The software can also prepare a processing report for each workpiece processed through the system including the targeted process compared to the actual process, which can be used to determine fault analysis and process boundaries. Feedback of the process parameters into an automated control loop (e.g., a knowledge based routine) allows high leverage in developing processes. The software may incorporate data gathered from one or more metrology processes to enhance such process development, for example to monitor and adjust etching rates, deposition thicknesses, and contamination. The software can preferably operate all system functions, including process sequences, process parameters for each sequence, etc., although pattern exposure may be controlled by a pattern generation system. The software can produce interlocks based on the process sequences and can provide full automation and optimization of the processes. Other configurations are possible. User control and adjustment is also used in certain embodiments.

Etching is a process for the manufacture of semiconductor circuits. High leverage microelectronic integrated circuits generally utilize high resolution etching of materials to within a critical dimension and location. The ability to etch metals, semiconductors, and dielectrics with precise control over feature depth, uniformity, anisotropy, and reproducibility is desirable for many applications. Standard processing techniques typically utilize a resist-related patterning step followed by a wet or dry chemical etch to perform material removal.

Resist patterning limits the quality of the etch process profile, size, depth, and uniformity. Milling, or etching after exposure by a focused ion beam, provides high resolution removal of material without the use of resist. However, high dose and low sensitivity cause slow speed of the equipment, and milling has not been commercially successful. Chemically assisted processes (e.g., chemically assisted ion beam etching (CAIBE) and reactive ion etching (RIE)) were introduced to enhance milling, but they could not be incorporated into FIB equipment because the gas reacted with several components within the exposure chamber. In contrast, as described herein, low dose procedures in combination with concentrated charged particles in groups compatible with resistless processing provides quality patterns and high throughput.

In certain embodiments, etch, implant, and deposition of the workpiece can be performed within the exposure chamber 102. Multiple activation by exposure to a digital beam and a process gas can dramatically improve the efficiency of all three processes. A digital beam specifically designed for a particular process in terms of energy, species, and current, which is possible because the digital beam parameters are adjustable, can impact and decompose a portion of the process gas molecules. The decomposed molecules strike surface atoms of the workpiece to sputter or implant new atoms into the workpiece, or to deposit new atoms on the workpiece surface. In some embodiments, portions and/or all of the workpiece is heated during exposing.

A new family of etching techniques is ideally suitable for high resolution, high throughput microelectronics manufacturing using a resistless process. This new process family is called digital beam assisted chemical etching (DBACE), and is up to 10 to 100 times more sensitive to ion exposure than milling. The process comprises at least two steps including digital beam exposure of a pattern to the regions to be etched. The target surface of a workpiece is exposed to very low dose ion energy, creating a reactive region for the chemical agent. The workpiece is then introduced to reactive gas within a separate chamber. As a result, a high resolution dry chemical etching process actively removes the material within the desired location as a parallel process to digital beam pattern exposure on other workpieces within the exposure chamber. As an example, DBACE can be performed on silicon and silicon dioxide ($SiO_2$) with chlorine ($Cl_2$) or fluorine ($F_2$) gas, on gallium arsenide (GaAs) with $Cl_2$, on carbon (e.g., diamond) with oxygen (e.g., $O_2$) and nitrous oxide ($N_2O_3$), on tungsten and molybdenum with carbon bromine trifluoride ($CBrF_3$) and high temperature superconductors (e.g., cuprates such as $La_{1.85}Ba_{0.15}CuO_4$, $YBa_2Cu_3O_{7-x}$ (yttrium barium copper oxide, YBCO, Y123, yttrium barium cuprate), and cuprate-perovskite ceramics with or without normal metallic regions) with wet hydroxide chemicals (e.g., sodium hydroxide (NaOH), potassium hydroxide (KOH)). DBACE has been successfully applied to etch the gate recesses of gallium arsenide field effect transistor (FET) devices without destroying the underlying active device region.

Figure 9A:
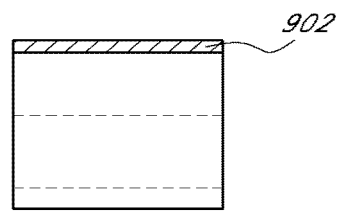
FIGS. 9A through 9C schematically illustrate cross-sections of a workpiece at various stages of an example digital beam assisted chemical etching process.
Figure 9B:
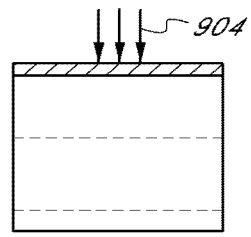
Figure 9C:
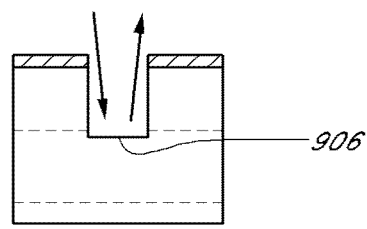

FIGS. 9A-9C schematically illustrate an example digital beam assisted chemical etching process. In FIG. 9A, an oxide layer 902 has been deposited over gallium arsenide. In FIG. 9B, the oxide layer 902 is exposed in an exposure chamber 102, for example with gallium ions ($Ga^+$), depicted as arrows 904. The workpiece is then transferred to an etchant chamber. In FIG. 9C, a chlorine ($Cl_2$) etch removes the oxide layer that was exposed in the exposure chamber 102, as well as underlying gallium and arsenic as gallium chloride ($GaCl_2$) and arsenic chloride ($AsCl_2$), respectively. The result is a trench in the gallium arsenide, as depicted in FIG. 9C. It will be appreciated that other ion species and etching species may be selected depending on the material or materials to be etched.

The deposition of thin films has been a staple process in microelectronics fabrication. Many techniques have been used to deposit thin films, including evaporation, physical vapor deposition (PVD) (e.g., sputter deposition), chemical vapor deposition (CVD), atomic later deposition (ALD), plating (e.g., electroplating), and coating (e.g., spin coating). In conventional fabrication, these techniques normally deposit material on an entire surface of a workpiece, and the material is formed into patterns by a liftoff or milling process using a resist patterning process. Due to the cost, complexity, and physical limitations of resist patterning processes, other non-resist techniques are generally preferred in semiconductor processing. Deposition techniques that may advantageously avoid resist patterning processes by exposure to a particle beam before, during, or after the application of a deposition process include particle beam and thermally activated deposition, for example, but not limited to, digital beam activated CVD, digital beam activated thermal nucleation, digital beam activated ALD, and chemically-assisted digital beam deposition.

Two examples of direct pattern deposition are ion beam nucleation deposition (IBND) and chemically assisted ion beam deposition (CAIBD). Both techniques decompose or nucleate atoms on the surface of a workpiece, but can be limited by slow beam writing techniques. CAIBD is described above with respect to advantages in using a digital beam, although it may be performed without a digital beam. IBND is a multi-PVD/CVD process in which an organic gas is introduced to a workpiece after it has been exposed by a particle beam. Growth occurs from the nucleation (exposed) sites similar to ALD. IBND generally employs an ion dosage that is about five orders of magnitude less than CAIBD, which enables IBND to be more than 100,000 times faster than CAIBD.

In situ deposition processes provide a variety of desired materials for the fabrication of silicon complementary metal-oxide semiconductors (CMOS), gallium arsenide, and other devices. However, deposition throughput and film quality are highly desired for such processes. Prior to IBND, reasonable throughput deposition for wafer fabrication was not possible using in situ beam processing. As an example, the rate of film deposition for CAIBD using a large ion dosage (e.g., $4 \times 10^{16}$ ions/$cm^2$) would be limited by the beam current to about 100 A/$cm^2$, and it would take over 20 years to deposit one square centimeter for a layer 500 Å thick. IBND, however, is able to produce desired film thicknesses while also satisfying throughput and quality concerns. For example, a process resulting in 30% coverage of the usable surface of a 300 mm diameter workpiece (about 200 $cm^2$) by 2.5 Å of deposited material would take about five seconds to expose using an exposure chamber 102 having a beam current density of 10 A/$cm^2$, which can expose nucleation sites on the order of 10 $cm^2$/s. The workpiece can then be transported to a nucleation chamber for deposition while another workpiece is exposed in the exposure chamber 102.

Figure 10A:
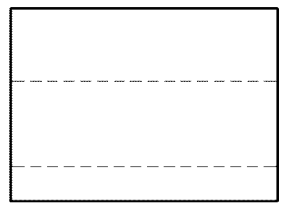
FIGS. 10A through 10C schematically illustrate cross-sections of a workpiece at various stages of an example digital beam assisted deposition process.
Figure 11A:
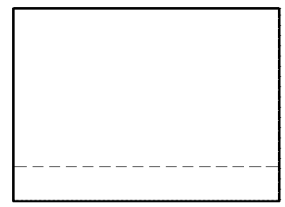
FIGS. 11A through 11D schematically illustrate cross-sections of a workpiece at various stages of an example digital beam implantation process.
Figure 10B:
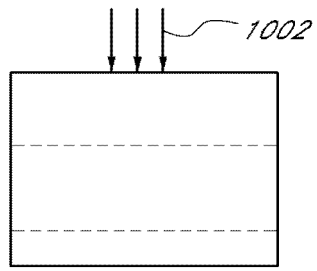
Figure 11B:
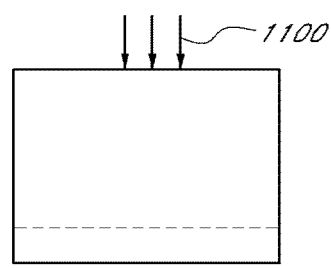
Figure 10C:
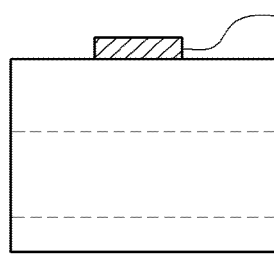

FIGS. 10A-10C schematically illustrate an example digital beam assisted deposition process. Starting with an unprocessed workpiece in FIG. 10A, portions of the workpiece are exposed with groups of charged particles of a digital beam, represented by arrows 1002 in FIG. 10B. The workpiece is then transferred to a deposition chamber, where it is exposed to reactant (e.g., a reactant fluid, preferably a reactant gas). The reactant reacts with the exposed areas to nucleate or atomically deposit a material, resulting is the workpiece of FIG. 10C with an area 1104 of deposited material.

Integrated microelectronic manufacturing of silicon, gallium arsenide, and other electronics utilize ion implantation to alter device mobility profiles at transistor junction edges. Traditional implantation techniques generally include resist deposition, patterning, development, and baking, followed by ion implantation, resist removal (e.g., by ashing and/or stripping), and cleaning. Device fabrication uses a series of these implantation techniques, thereby requiring a large number of patterning steps. Patterning may be reduced by using serial implantation, but devices incorporating gradient implantation, lightly doped drains (LDD), and co-implantation, which can achieve higher performance, typically trade process simplification for increased device performance. For example, high resolution implantation placement accuracy may result in increased device reliability and/or process robustness. Throughput limitations associated with the traditional implant techniques are exacerbated by devices that require a large number of implantations. Using a conventional CMOS process as an example, implantation alone (i.e., resist deposition, patterning, development, and baking followed by ion implantation, resist removal, and cleaning) may require about 70 process steps. As a result, the cost of the next generation, high leverage electronics can be substantial.

The development of such implantation schemes can be particularly costly. For example, the fabrication of reticle masks used in the resist patterning steps may take on the order of months and tens of thousands of dollars. Process development (e.g., the resist exposure conditions appropriate for the reticle, resist type, resist thickness, etc.) may take additional months. Once developed, pilot fabrication can take weeks or months. If testing reveals defects in the reticle design or the process steps, the process may need to start over, and iterates until a functional device can be reliably created. Such lengthy development is impractical or even impossible for certain devices (e.g., specialty military devices where a limited number of devices will be produced).

The use of resistless, direct write implantation can provide the manufacturing flexibility and quick development time to incorporate advanced techniques (e.g., single-level gradient implantation, LDD, and co-implantation) in research, pilot production, and full production environments. Such a system can achieve vertical implantation profiles ranging from about 5 kilo electron volts (keV) to about 500 keV within, for example, about 20 nm. These systems can have the flexibility to select the species of the ion beam and to place the beam within 9 nm of itself in a gradient energy or dose profile, which can be used to achieve advanced implantation processes such as gradient implantation, LDD, and co-implantation.

Figure 11C:
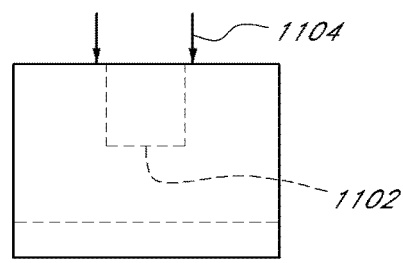
Figure 11D:
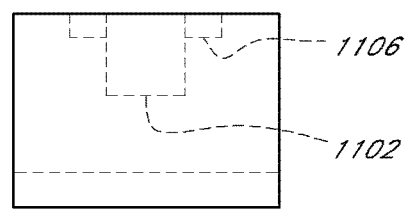

FIGS. 11A through 11D schematically depict a cross-section of a workpiece processed with direct write implantation. Starting with an unprocessed workpiece in FIG. 11A, the workpiece is implanted with a first set of digital beam exposure profile, represented by arrows 1100 in FIG. 11B. The result is a workpiece of FIG. 11C with an area 1102 of doped material. An implantation with a second digital beam exposure profile, represented by arrows 1104 in FIG. 11C, is then performed. The result is a workpiece of FIG. 11D with doped area 1102 and doped areas 1106. The workpiece may be annealed after each implantation or after the series of implantations to activate the dopants. In certain embodiments, the workpiece illustrated in FIG. 11D can be performed with a single implantation, for example using the techniques illustrated in FIGS. 11E through 11I.

Figure 11E:
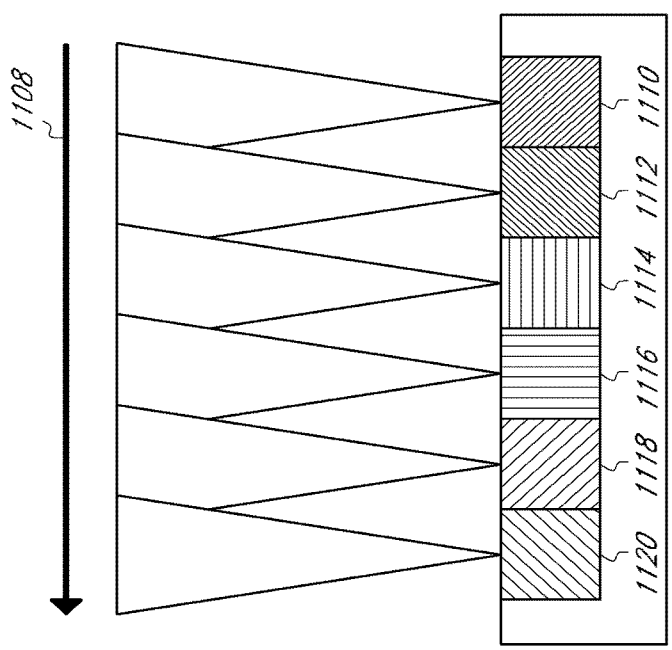
FIGS. 11E through 11I illustrate example modifications during a digital beam modification process.
Figure 11F:
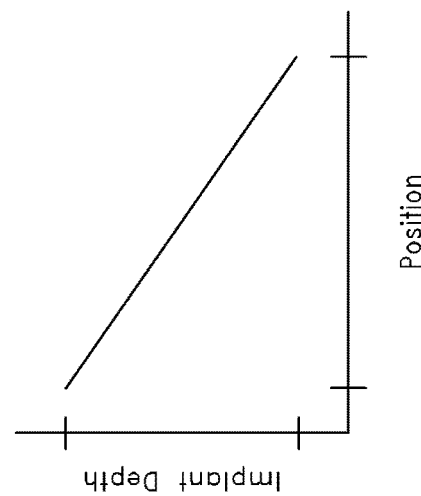
Figure 11H:
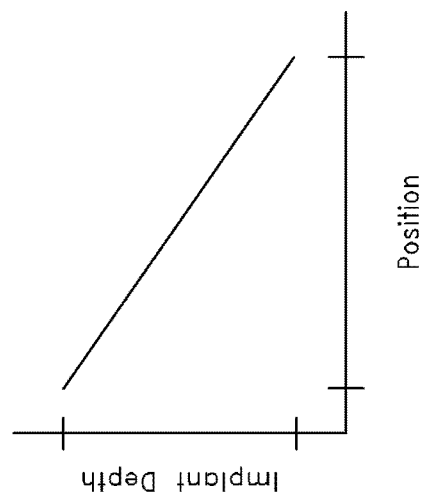
Figure 11G:
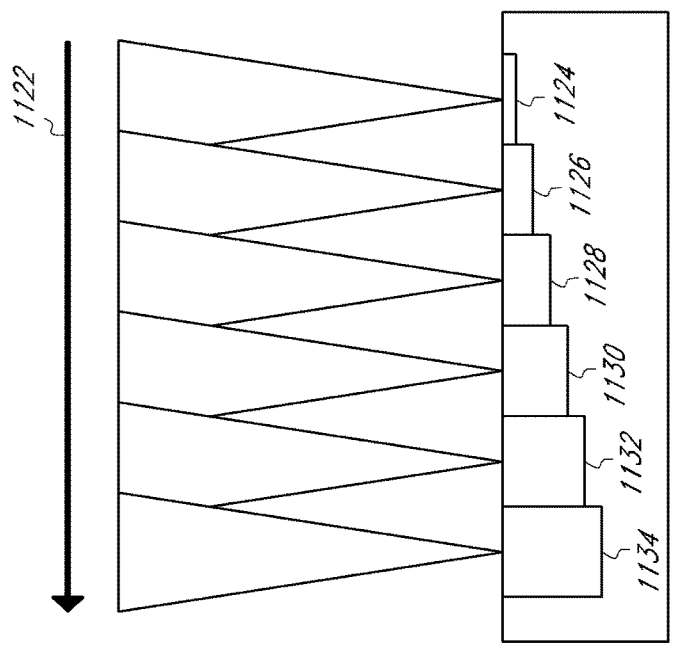
Figure 11I:
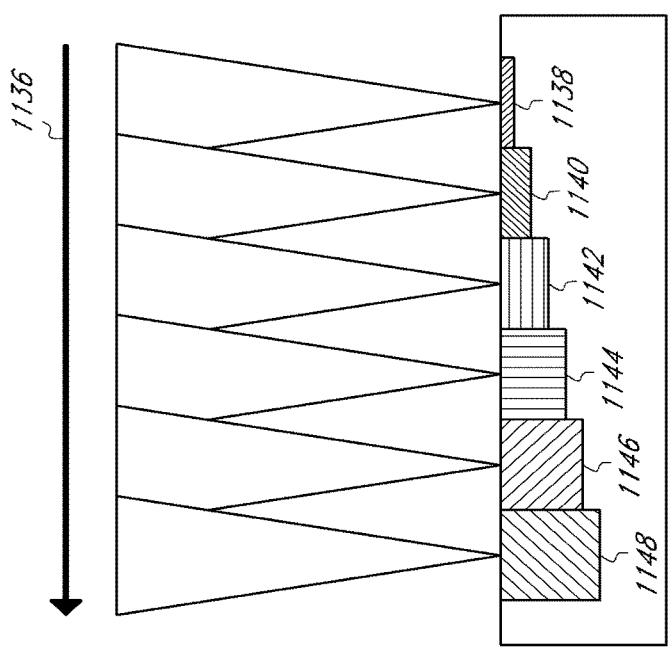

In FIG. 11E, the charged particle density of the groups of charged particles are altered as they are scanned across the workpiece, illustrated by arrow 1108. Area 1110 of the workpiece is lightly doped (e.g., $n^-$) while area 1120 is heavily doped (e.g., $n^{++}$). FIG. 11F is a plot of the log of dosage versus position of a workpiece similar to that of FIG. 11E. The dosage profile can become linear by, for example, overlapping the beams of FIG. 11E. In FIG. 11G, the energy of the beam is altered as it scans across the workpiece, illustrated by arrow 1122. Area 1124 of the workpiece is shallowly doped (e.g., like a lightly doped drain) while area 1134 is deeply doped (e.g., like an n-well). FIG. 11H is a plot of the implant depth versus position of a workpiece similar to that of FIG. 11G. The dosage profile can become linear by, for example, overlapping the beams of FIG. 11G. In some embodiments, the energy varies between about 5 and 500 keV, or more preferably between about 5 and 200 keV. In FIG. 11I, the charged particle density of the groups and the energy of the groups are altered as the digital beam scans across the workpiece, illustrated by arrow 1136. Area 1138 of the workpiece is both lightly and shallowly doped while area 1148 is both heavily and deeply doped. Although not illustrated, it will be understood that other beam parameters, for example species, may also be altered. In certain embodiments, the beam is altered across a transistor, across a die, or across a workpiece. In certain embodiments, the beam is altered within about a 20 nm area on the workpiece. Alteration of the beam may also enhance etching, deposition, and other processes.

The standard approach for achieving acceptable levels of reliability in devices with gate lengths under 1.5 μm is to incorporate the use of a lightly doped drain (LDD) process. This two-step implantation process creates source and drain regions that lower the electric field near the channel edge, which lowers the impact ionization rate and results in fewer hot carriers available for migration into the gate oxide, thereby enhancing the long term reliability of the device. Beam implantation enables proper horizontal grading of the source/drain implant, which allows completion of the entire LDD process in a single step. As such, beam implantation can eliminate two photoresist steps and the need for a sidewall spacer and its associated etching process, which can particularly affect yield due to damage to the silicon substrate.

Figure 12A:
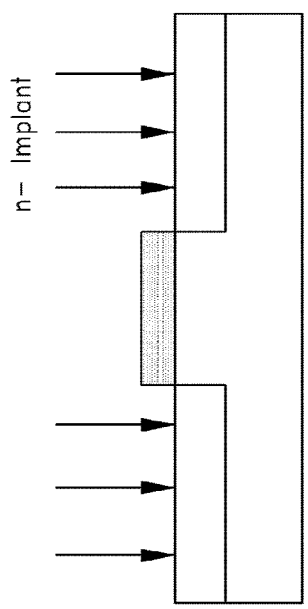
FIGS. 12A through 12C depict example schematic cross-sections of lightly doped drain structures processed with a controlled particle beam.
Figure 12B:
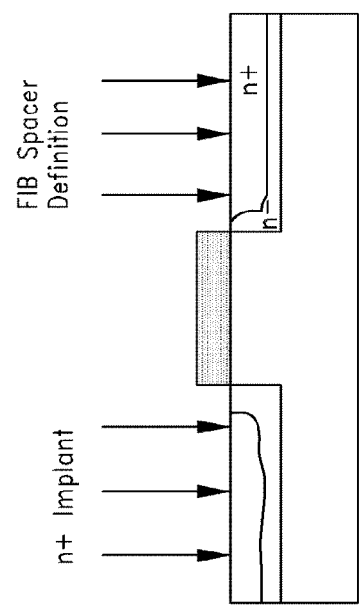
Figure 12C:
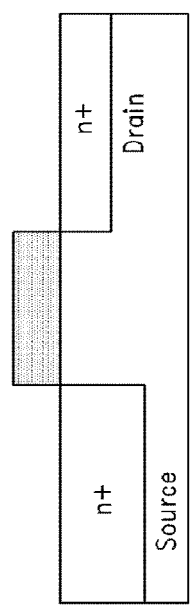

The LDD process can degrade the peak transconductance of a 1 μm gate length device by roughly 10% and a 0.5 μm gate length device by as much as 20%. However, elimination of ion implantation on one side can result in considerable improvements in device performance. With conventional processing, this would require additional patterning steps to mask the source side, and hence is almost never performed. Beam implantation, however, allows the LDD to be placed only on the drain side of the transistor channel, where the electric field is high, and ion implantation can be omitted from the source side. FIGS. 12A through 12C depict example schematic cross-sections of implant structures within workpieces that can be achieved with a single digital beam process step.

Beam implantation can also be used to improve device scaling. A limited factor in controlling device scaling is the source/drain junction depth. The shallower the junction, the fewer the short channel effects and the greater the degree of scalability. However, a shallow junction results in increased parasitic source/drain resistance. The impact of this source drain/resistance is appreciable for deep sub-micron devices.

The lateral grading potential of beam exposure can be particularly useful in this instance, for example by making a drain that is very shallow near the transistor channel yet deep under the transistor contact. The shallow junction near the channel edge results in reduced short channel effects, while the deep junction under the contact promotes low series resistance. Another option is placing a deep junction on the source side and a graded junction on the drain side. This can keep the series resistance at a minimum on the source side where it is most important while reducing the negative effect of drain induced barrier lowering on the drain side.

Figure 13A:
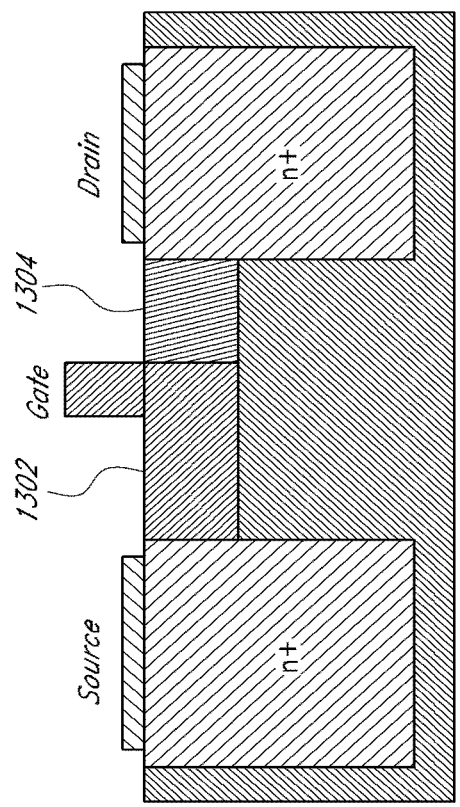
FIGS. 13A and 13B depict an example schematic cross-section of a lateral channel doping structure processed with a controlled particle beam and a doping concentration profile thereof, respectively.
Figure 13B:
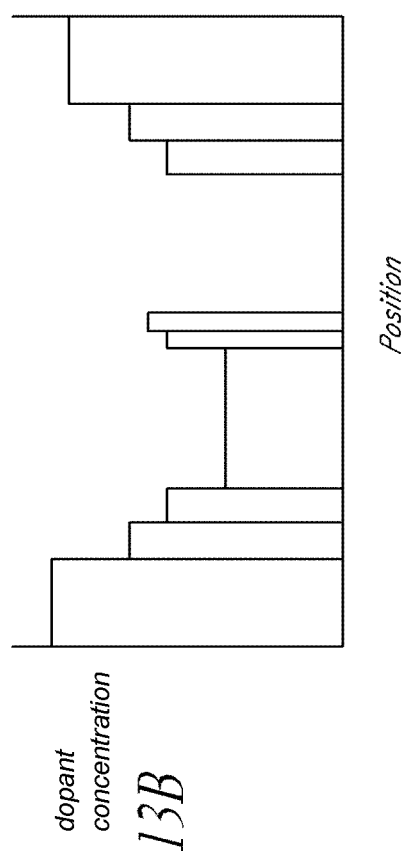

Lateral channel doping variations produced by digital beam implantation permit the construction of high performance, high yield planar gate FETs. LDD regions increase the output resistance and breakdown voltage of the transistor, which increases power capability. As illustrated in FIG. 13A, increasing the doping of the source and beneath the gate (area 1302 of FIG. 13A) can reduce the source-gate resistance to improve the FET transconductance and gain by increasing the channel current. These desired lateral doping variations, illustrated by the chart of FIG. 13B, can be produced by varying the implant dose in segments along the length of the channel. The number of different segments that can be used is only limited by the digital beam size.

Figure 15:
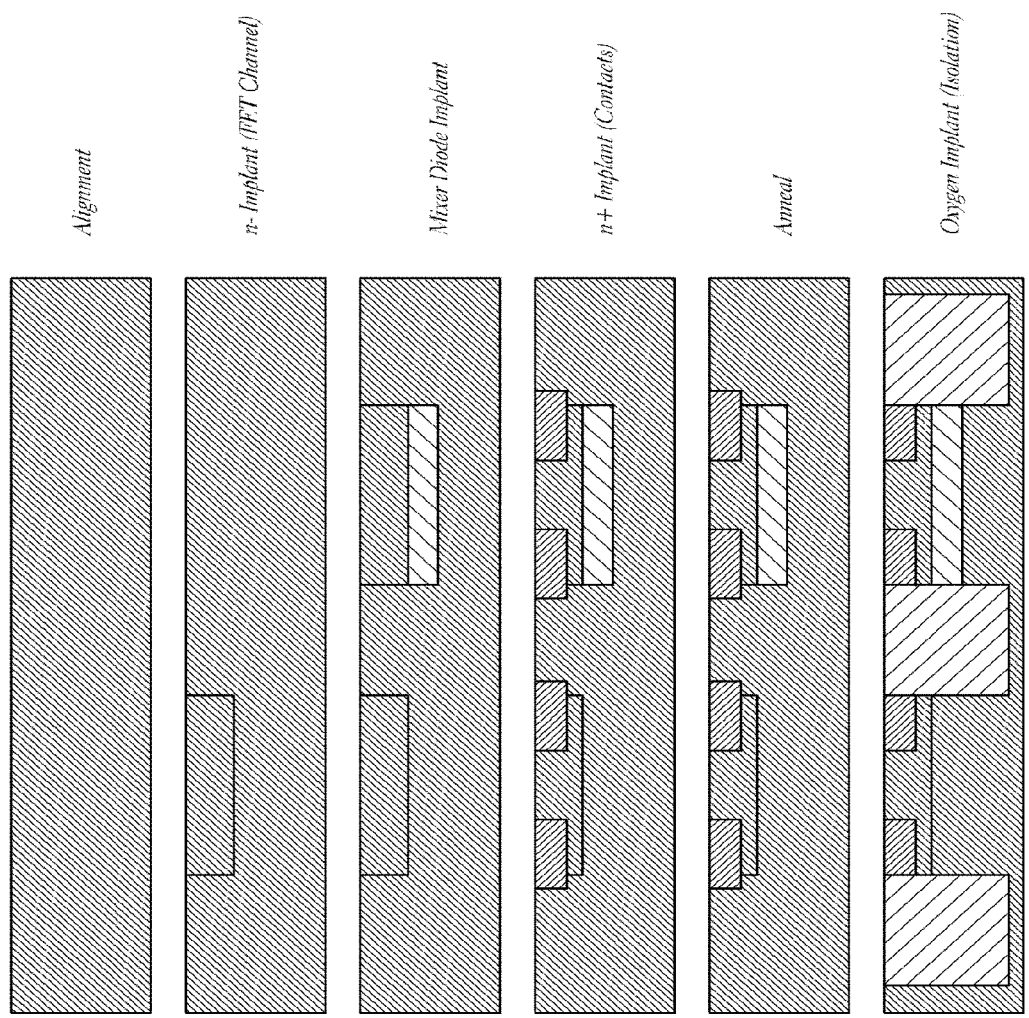
FIG. 15 depicts example schematic cross-sections of gallium arsenide diode structures over time as processed with a controlled particle beam.
Figure 16A:
FIGS. 16A through 16K depicts example schematic cross-sections of gallium arsenide microwave monolithic integrated circuit structures over time as processed with a controlled particle beam.
Figure 16B:
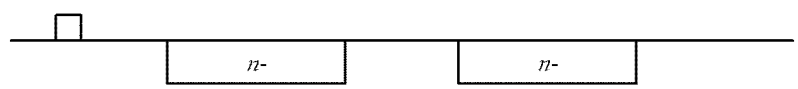
Figure 16C:
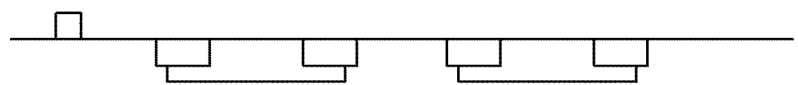
Figure 16D:
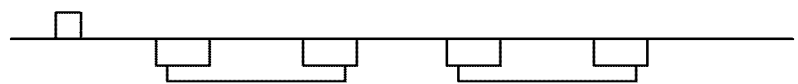
Figure 16E:
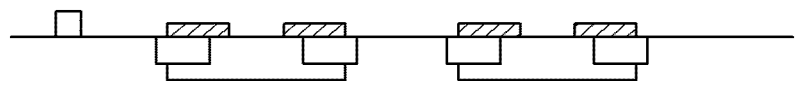
Figure 16F:
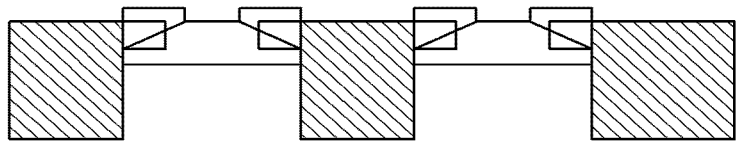
Figure 16G:
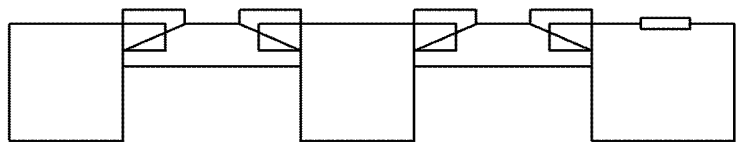
Figure 16H:
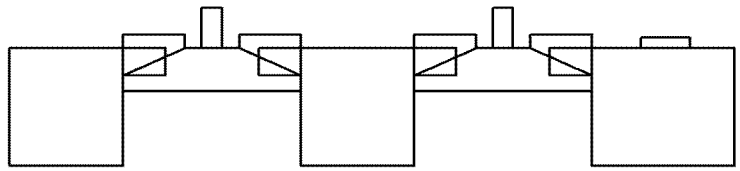
Figure 16I:
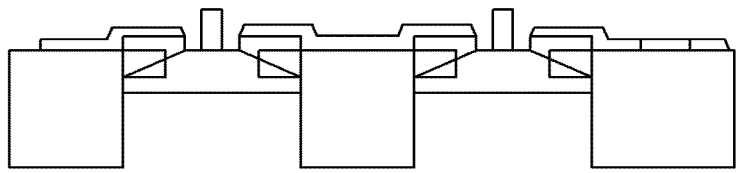
Figure 16J:
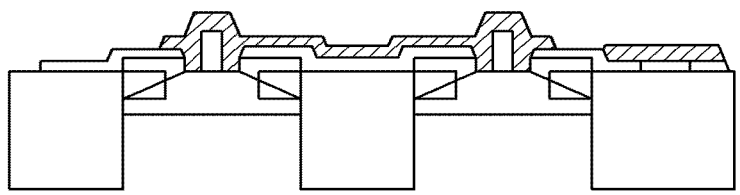
Figure 16K:
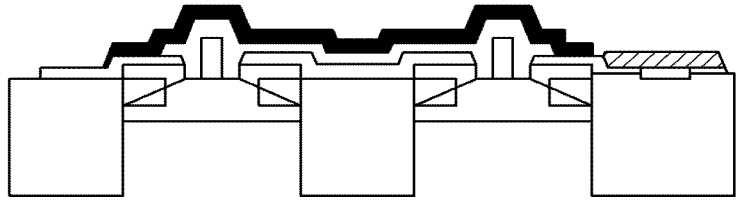

Although GaAs FETs are a key element of many microwave (or millimeter-wave) monolithic integrated circuits (MIMIC), other elements such as Schottky diodes are frequently fabricated on the same workpiece for high performance devices. However, a FET gate cannot be used as an ideal diode because the cutoff frequency is much lower than a high quality Schottky diode. Fabrication of FETs and Schottky diodes on the same workpiece is difficult to accomplish with either epitaxial growth or blanket implantation processing. Digital beam processing is well suited for selective ion implantation processing of FETs and diodes on the same workpiece because the ability to perform discrete processing at different location on the workpiece, as illustrated in FIG. 15. The resulting devices are substantially planar, which improves yield. As is true with all processes described herein, other processing steps may be combined with traditional processes.

GaAs MIMICs are traditionally produced using blanket implantation and deposition steps, and batch etching and alloying steps. Photoresist is used to selectively mask and define the device and circuit patterns at each level. Altogether, traditional methods employ over 25 different process steps including 12 mask levels. The front-end (topside) process alone typically takes over 240 hours to complete for a 6-workpiece batch. The process is very inefficient because of the large amount of overhead time and touch labor required. GaAs MIMIC processing can be significantly improved and simplified to increase yield and lower cost by designing a digital beam process of selective pixel based implantation, deposition, and etching. Digital beam processing offers tremendous benefits in simplification and improvement of the GaAs MIMIC process, thereby leading to faster cycle times, higher circuit yields, and lower chip costs. In situ processing can eliminate more than a dozen process steps that typically take nearly 100 hours to perform, and enables major process modifications for improving device performance, yield, lowering cost, and expanding capability within an acceptable timeframe. For example, a digital beam process may comprise only 9 steps and 19 operations, reducing cycle time to 40 minutes per wafer. As illustrated in FIG. 16A through 16K, an example GaAs MIMIC digital beam process comprises selective channel and contact implants followed by annealing. Ohmic contacts are delineated and contact metal is deposited by digital beam deposition followed by digital beam isolation implant. The contacts are alloyed by annealing. Thin film resistors, FET gates, metal interconnects, insulators, and passivation layers are digital beam deposited.

Multifunction MIMICs (MFICs) integrate multiple functions in a single device. Traditionally, GaAs MFICs have been fabricated with increased levels of integration of receiver functions, combining analog and digital functions, and combining transmitter and receiver functions. MFICs lower system cost by reducing parts count, size, weight, and assembly/tune costs. Wafer scale integration (WSI), which would integrate many dissimilar functions to form a complete system on a wafer, is well suited for many generation of future microelectronics. MFICs are generally required for advanced phased array antenna systems, which integrate complex radio frequency functions with optical control and digital signal processing. An example is the System Level Integrated Circuit (SLIC). Most of the components developed for phased array applications are designed individually using hybrid assembly techniques. Sufficient support functions are not integrated, hence, cannot be inserted into the system directly. Monolithic integration of the circuit functions reduces part count, size, weight, and assembly costs.

Figure 14B:
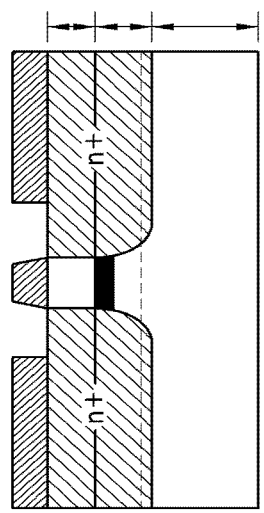
FIGS. 14A and 14B depict example schematic cross-sections of heterojunction insulating gate field effect transistor structures processed with a controlled particle beam.
Figure 14A:
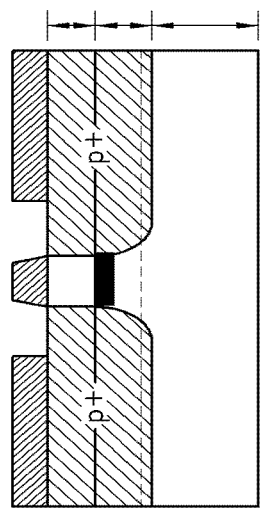

High electron mobility transistors (HEMT) are heterojunction FETs with greatly improved performance over conventional GaAs FETs. HEMTs are generally used in high speed digital circuits and low noise amplifiers operating at millimeter-wave frequencies. High speed, ultra-low power digital circuits typically have complementary n-channel and p-channel FETs fabricated on the same workpiece, which is difficult, even with selective epitaxial material growth techniques. Digital beam processing implantation is well suited to fabricate complementary heterojunction insulating gate (HIG) FETs on the same wafer. Cross-sections of the basic n and p channel HIGFET devices are shown in FIGS. 14A and 14B, respectively. The devices are substantially planar and embedded in a semi-insulating substrate. A digital beam comprising silicon can be used for the n-channel device implant, and digital beam comprising beryllium can be used for the p-channel device implant. The metal-silicide gate (e.g., Schottky gate) and ohmic contacts (e.g., comprising AuGe, AuZn) can be deposited by digital beam deposition. Such a sequence allows a two step in situ device fabrication process. As a result, the unique features of the device would be a high resolution duel proximity printing with a minimum step process.

Figure 17:
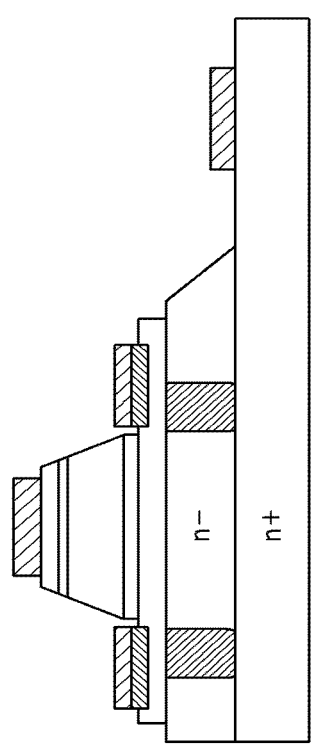
FIG. 17 depict an example schematic cross-section of a heterojunction bipolar transistor structure processed with a controlled particle beam.

Heterojunction bipolar transistors (HBTs) are typically used in devices with high linearity, precision analog, digital/digital converter, and microwave power applications. However, current gain and maximum frequency of oscillation are limited by parasitic base resistance and collector capacitance, respectively. The performance and yield of GaAs HBT devices can be improved with selective digital beam implantation. FIG. 17 represents an example cross-section of a workpiece under such an application. First, beryllium implants into the substrate before contact metallization reduces contact resistance. The base layer can have a lower doping concentration for the same base contact resistance, which increases the current gain by promoting electron transportation through the p-type base. Second, oxygen or boron implantation between the emitter and base electrodes electrically isolates and confines the electron current to flow vertically through the device rather than recombining laterally. This reduces stray capacitance and improves the operating frequency. Such fabrication processes are difficult to perform with standard photoresist processing techniques because of the small dimensions and because photoresist processing increasing surface recombination which decreases gain.

The lateral doping capability of a beam implant can also improve device scalability through use of channel stop implants. Such channel stop implants usually reduce the effective device width of narrow transistors, reducing the junction capacitance and increasing the performance of the technology. With conventional implants, difficulty in tailoring the doping concentration along the edge of the field oxide can result in more implant than needed going into the active area. With a beam exposure, the implant can be spatially controlled to keep a sufficient, but not excessive, surface concentration along the field oxide edge.

Figures 19A, 19B:
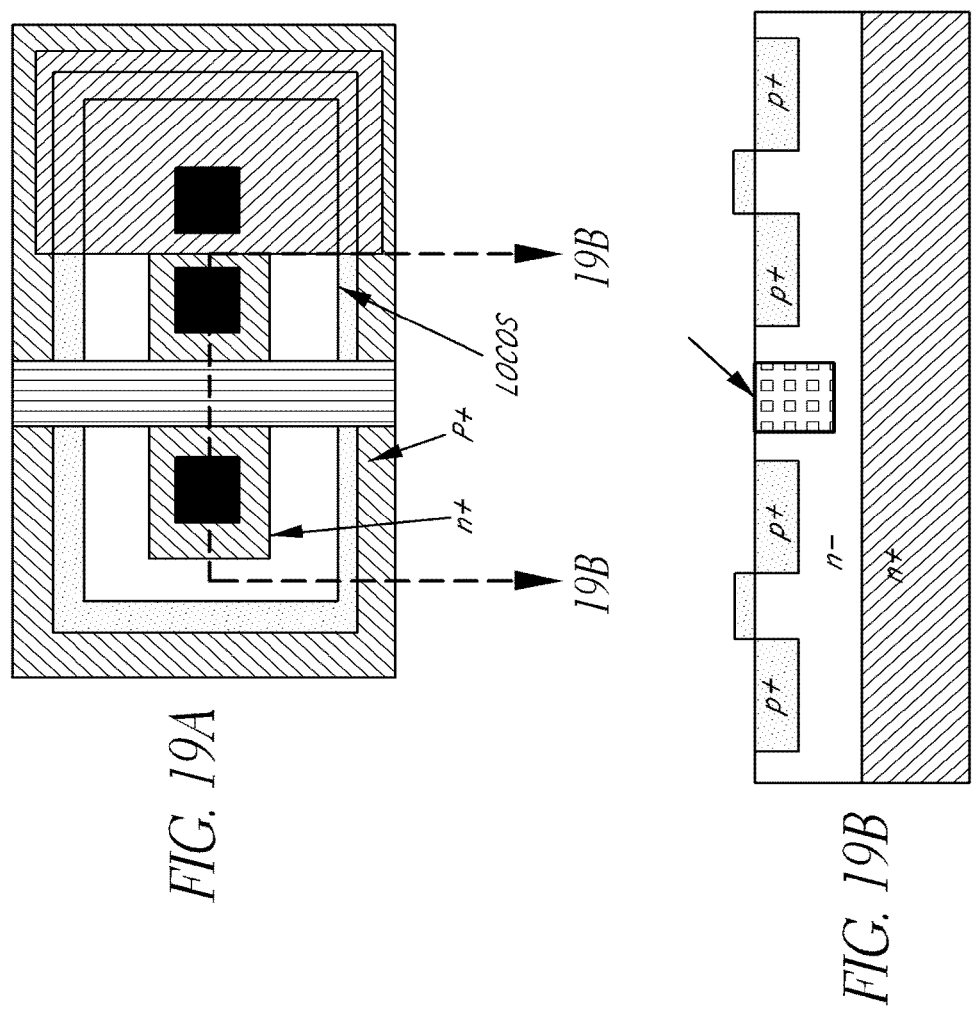
FIG. 19A depicts an example schematic top view of a radiation hardness structure processed with a controlled particle beam.
FIG. 19B is a schematic cross-sectional view of the radiation hardness structure of FIG. 19A taken along line 19B-19B.
Figure 20:
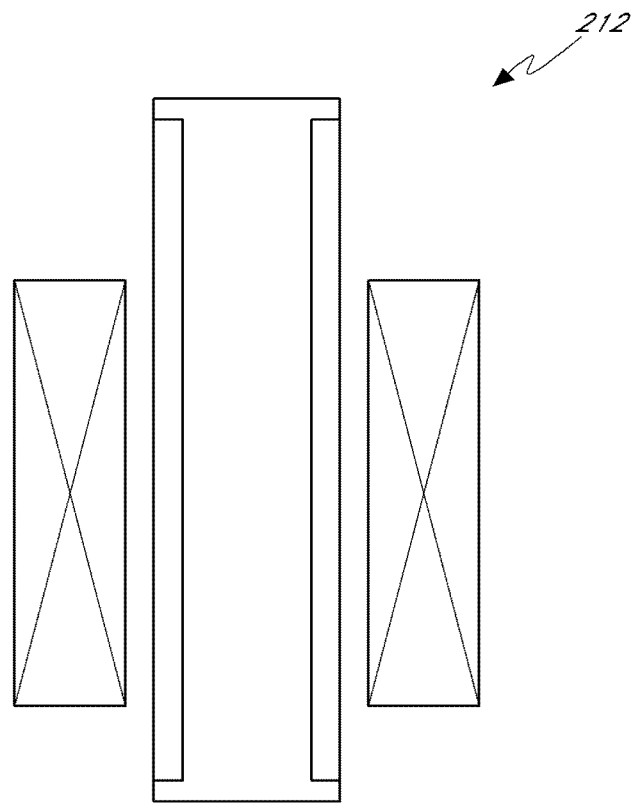
FIG. 20 depicts an exploded cross-sectional schematic view of an objective lens assembly.

Varying the channel stop implant can include grading a channel stop or guard ring implant along a bird's beak to prevent field inversion resulting from ionizing radiation. Guard ring approaches normally result in large area penalties because the implant dose required for hardness is sufficiently high to promote breakdown problems from the close proximity of $n^+/p^+$ regions. Leaving a space between the guard ring and the $n^+$ implant layers can solve this breakdown problem (e.g., as depicted in FIG. 19A). Although effective, this approach can result in a large density penalty, especially as devices are scaled into the sub-micron regime. Using a digital beam exposure, a horizontal doping gradient can decrease the ion dosage near the junction edge, where the field oxide is thin and thus less sensitive to radiation, and can increase the ion dosage under the thicker part of the field oxide. Using such a strategy can achieve excellent radiation hardness, while not compromising the layout density due to the potential breakdown problem. Implantation of a non-conducting layer can be used to form a very dense isolation approach. An implantation of sufficient dosage (e.g., between about $1\times10^{15}$ charged particles/cm$^2$ and $1\times10^{17}$ charged particles/cm$^2$) forms amorphous regions with essentially infinite resistivity (e.g., as depicted in FIG. 19B). Devices can thus be isolated from each other by this high resistance region. The dimensions of this isolation region can be extremely small, for example much smaller than an oxide isolation guard ring, resulting in greatly improved circuit densities.

In some CMOS applications, the use of a bipolar transistor can be very desirable. This has led to the widespread interest in BiCMOS technology. Many of these applications do not require a high frequency bipolar device, and hence the greatly increased process complexity associated with BiCMOS is not warranted. A lateral bipolar device exists in every CMOS technology, but typically performance is too poor to have widespread use. Using beam exposure implantation can greatly improve the performance of this lateral bipolar transistor technology. Horizontal grading in the channel (base) region can result in electric field aided minority carrier transport, improving both transistor beta and transition frequency ($F_t$). An LDD process destroys the emitter efficiency of this bipolar device, so the ability to selectively place LDDs on the drain side of the channel allows the source regions to act as emitters and to not be processed as LDDs.

Figure 18:
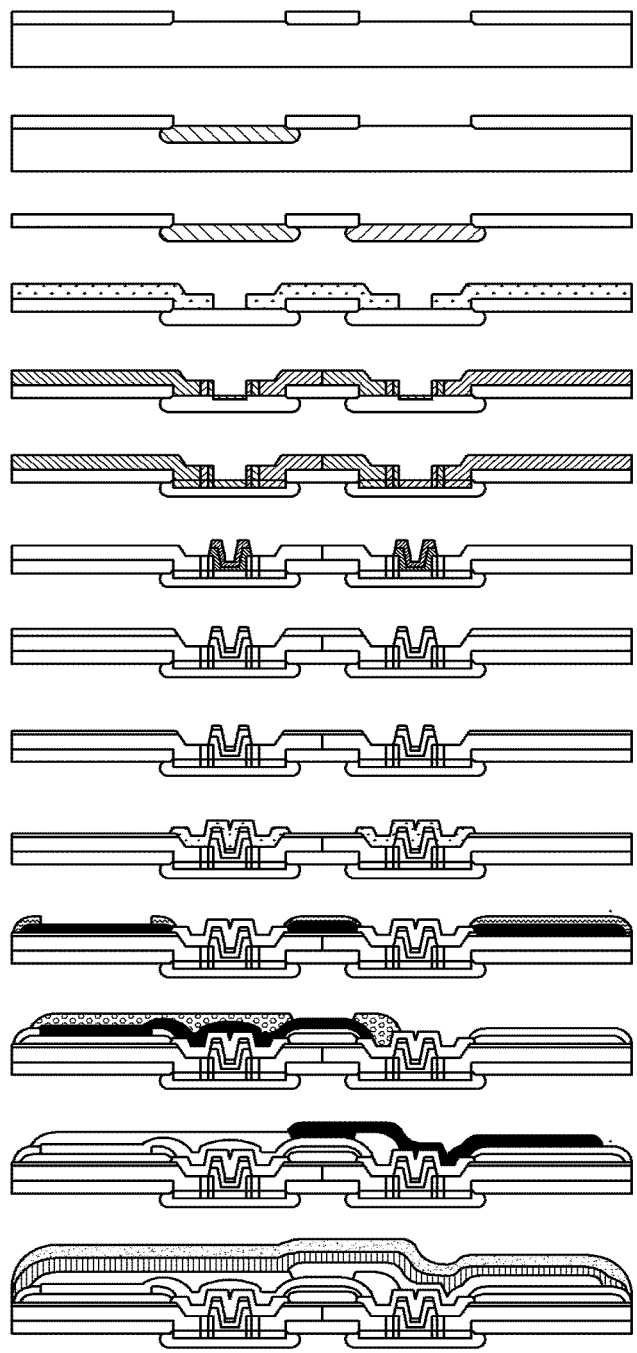
FIG. 18 depicts example schematic cross-sections of a semiconductor structure over time as processed with a controlled particle beam.

It will be appreciated that digital beam implantation can be used for other applications and devices, and the embodiments described herein are only examples. It will also be appreciated that combinations of digital beam processes including etch, implant, and deposition can be used to form a wide variety of semiconductor devices and the embodiments described herein are only examples. For example, FIG. 18 depicts a process sequence for building a substantially completed semiconductor device. Some steps may be performed with traditional methods and combined with digital beam processing, or, preferably, each of the process steps is performed using digital beam processing.

Annealing is a process by which the atoms or molecules in a material layer are heated or energized in order to activate dopants, change film-to-film or film-to-wafer substrate interfaces, densify deposited films, change states of grown films, repair damage from ion implantation, move dopants, drive dopants from one film into another or from a film into the wafer substrate, to drive off excess solvents (e.g., from resist deposition, spin-on dielectrics, etc.), and the like. As such, annealing is particularly useful in conjunction with direct write processes. However, it will be appreciated that a workpiece need not be exposed in a beam exposure chamber prior to rapid thermal annealing.

Combinations of the above and other processes can be used to produce workpieces that are substantially finished (e.g., ready for passivation, ready for die cutting, etc.) from a bare substrate (e.g., a single-crystal wafer, a workpiece with a deposited field oxide) in a single processing tool.

The demand for military and commercial electronics will continually drive advances in a wide range of integrated circuits that use the same or similar forms of logic cells. Over the past several years, multiple exposure technologies have been used to meet the demands of the ever decreasing next node critical geometries. Generally, increasing the number of processing steps reduces manufacturing yield and throughput, resulting in expediential cost increases per new design rule. A promising manufacturing technology, which simultaneously addresses cost, resolution, and throughput and process yield improvement does not currently exist for the future development of new devices. A paradigm combining semiconductor processing and lithography to offer digital beam pattern processing can thus provide a solution to the future of the industry.

Incorporating resistless digital beam exposure aided deposition, etching, and implantation processing on a fully automated, high throughput cluster processing tool can provide a significant reduction in the manufacturing cost of high performance and/or high density integrated circuits. For example, the manufacture of a partially in situ 15 nm source/drain BiCMOS device can include the spontaneous nucleation of tungsten, silicon oxide, and platinum for the alignment or metallization, dielectric insulators, and silicide, respectively. A deep sub-micron polysilicon gradient implantation source/drain technology can be used to minimize the number of implantation levels while maximizing the performance of the devices. DBACE can be used for LOCOS and the formation of gate oxides. Polysilicon for the implantation, gate, and passivation levels can be deposited on the entire wafer in a CVD chamber on the apparatus. The field oxide can be the only ex situ process done outside of the system prior to all other processes.

Several different pixel/digital beam spot size combinations can be used for exposure at different workpiece levels in order to simultaneously maximize the resolution and throughput of the processing tool. Exposure strategies can also be used to compensate for uniform nucleation deposition as discussed above. To increase the sensitivity of the digital beam exposure aided deposition process, several levels can be exposed with reduced beam current density without reducing the throughput of the system. In order to perform a complete in situ process, the tool can include one or more dedicated oxidation (e.g., plasma enhanced CVD (PECVD)) and nucleation chambers.

A wide variety of variations are possible. Components may be added, removed, or reordered. Different components may be substituted out. The arrangement and configuration may be different. Similarly, processing steps may be added or removed, or reordered.

Those skilled in the art will appreciate that the methods and designs described above have additional applications and that the relevant applications are not limited to those specifically recited above. Also, the present invention may be embodied in other specific forms without departing from the essential characteristics as described herein. The embodiments described above are to be considered in all respects as illustrative only and not restrictive in any manner.

Applications for this technology are virtually unlimited and span far beyond the development of tomorrow's microelectronics components. Described above are a small number of high leverage electronics applications to demonstrate the potential of resistless processing, for example in the military and commercial electronics industries. A wide variety of other applications are possible. It will be appreciated that the majority of the in situ process steps can include a reduction in the system beam current density to 40 A/cm$^2$. This is equivalent to present day technology and greatly reduces the risk for each of these tasks.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A method of implanting particles into a workpiece, the method comprising:
    forming a beam of charged particles;
    adjusting a longitudinal spacing between the charged particles along the beam; and
    directing the beam towards the workpiece in a pattern in an exposure chamber.

2. The method of claim 1, wherein a dosage of the beam is less than about $5 \times 10^{17}$ charged particles/cm$^2$.

3. The method of claim 1, wherein a dosage of the beam is less than about $5 \times 10^{10}$ charged particles/cm$^2$.

4. The method of claim 1, wherein the workpiece is resistless while directing the beam.

5. The method of claim 1, further comprising, during directing the beam, exposing a surface of the workpiece to a reactant.

6. The method of claim 1, further comprising annealing the implanted particles.

7. The method of claim 1, wherein forming the beam comprises:
    forming a stream of the particles;
    collimating the stream along an axis of propagation; and
    digitizing the stream.

8. The method of claim 1, wherein forming the beam comprises creating temporally and spatially resolved digital flashes comprising at least one particle per digital flash.

9. The method of claim 1, wherein directing the beam comprises:
    deflecting the beam using a series of deflection stages disposed longitudinally along an axis of propagation of the beam; and
    demagnifying the beam.

10. A workpiece manufactured by the method of claim 1.

11. A method of implanting at least one dopant into a workpiece, the method comprising:
    forming a beam comprising a series of particles of at least one ion species;
    directing the beam towards the workpiece; and
    during directing, altering at least one parameter of the spacing of the particles in the beam.

12. The method of claim 11, wherein the parameter comprises ion species.

13. The method of claim 11, wherein the parameter comprises beam energy.

14. The method of claim 13, wherein altering the beam energy comprises varying the beam energy between about 5 and 500 keV.

15. The method of claim 11, wherein the parameter comprises a density of particles in the beam.

16. The method of claim 11, wherein altering the parameter is during directing the beam across a transistor on the workpiece.

17. The method of claim 11, wherein altering the parameter is during directing the beam across a die on the workpiece.

18. The method of claim 11, wherein forming the beam comprises forming a digital beam.

19. A workpiece manufactured by the method of claim 11.

20. A method of processing to implant material into a workpiece, the method comprising:
    directing a beam comprising charged particles which are spaced along a longitudinal direction of the beam onto the workpiece in a pattern in an exposure chamber, such that charged particles of the beam are sequentially directed to different positions on the workpiece.

* * * * *